United States Patent
Lisbona

(10) Patent No.: US 9,281,577 B2
(45) Date of Patent: Mar. 8, 2016

(54) CONTROL SIGNAL ROUTING APPARATUS

(71) Applicant: Lennox Industries Inc., Richardson, TX (US)

(72) Inventor: Randall Lee Lisbona, Coppell, TX (US)

(73) Assignee: Lennox Industries Inc., Richardson, TX (US)

( * ) Notice: Subject to any disclaimer, the term of this patent is extended or adjusted under 35 U.S.C. 154(b) by 157 days.

(21) Appl. No.: 14/144,434

(22) Filed: Dec. 30, 2013

(65) Prior Publication Data

US 2015/0188243 A1 Jul. 2, 2015

(51) Int. Cl.
| | |
|---|---|
| *H01R 33/90* | (2006.01) |
| *H01R 9/22* | (2006.01) |
| *H01R 31/06* | (2006.01) |
| *F24D 19/00* | (2006.01) |
| *H05K 7/02* | (2006.01) |
| *F24F 1/22* | (2011.01) |

(52) U.S. Cl.
CPC ............... *H01R 9/226* (2013.01); *F24D 19/00* (2013.01); *F24F 1/22* (2013.01); *H01R 31/06* (2013.01); *H05K 7/02* (2013.01)

(58) Field of Classification Search
CPC ....................................................... H01R 31/06
USPC .................................................. 439/638, 639
See application file for complete search history.

(56) References Cited

U.S. PATENT DOCUMENTS

| | | | |
|---|---|---|---|
| 4,595,812 A | 6/1986 | Tamaru et al. | |
| 4,622,444 A | 11/1986 | Kandatsu et al. | |
| 4,884,047 A | 11/1989 | Baginski et al. | |
| 4,884,164 A | 11/1989 | Dziura et al. | |
| 5,249,981 A * | 10/1993 | Abell et al. | 439/540.1 |
| 5,539,168 A | 7/1996 | Linzenich | |
| 6,217,370 B1 | 4/2001 | Scheel et al. | |
| 6,232,859 B1 | 5/2001 | Christensen et al. | |
| 6,364,718 B1 * | 4/2002 | Polgar et al. | 439/680 |
| 7,319,373 B2 | 1/2008 | Zindler | |
| 2006/0082979 A1 | 4/2006 | Brandl et al. | |
| 2013/0344746 A1 * | 12/2013 | Andersson et al. | 439/638 |
| 2015/0188243 A1 | 7/2015 | Lisbona | |

FOREIGN PATENT DOCUMENTS

DE 102009019577 A1 11/2010

* cited by examiner

*Primary Examiner* — Tho D Ta
(74) *Attorney, Agent, or Firm* — R. Johnston Law, PLLC

(57) ABSTRACT

A disclosed control signal routing apparatus includes a substrate, a routing connector having multiple electrical terminals and multiple portions, and multiple electrical conductors on or in the substrate. The terminals are arranged within a housing cavity. The conductors connect terminals of different portions of the routing connector. Each portion of the routing connector is adapted to receive a plug connector and includes two or more terminals. Another embodiment of the apparatus includes the substrate, multiple routing connectors, and a first and second set of conductor(s) on or in the substrate. Each routing connector includes a first, a second, and a third terminals, and two portions each adapted to receive a plug connector. The first set of conductor(s) connects the first terminals of routing connectors and sequential next routing connectors. The second set of conductor(s) connects third terminals of routing connectors to second terminals of sequential next routing connectors.

7 Claims, 12 Drawing Sheets

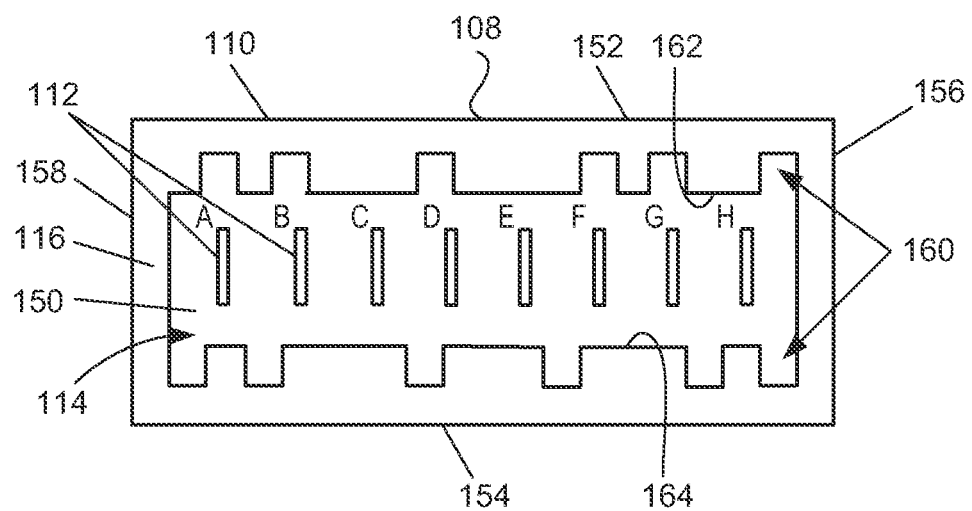
FIG. 3
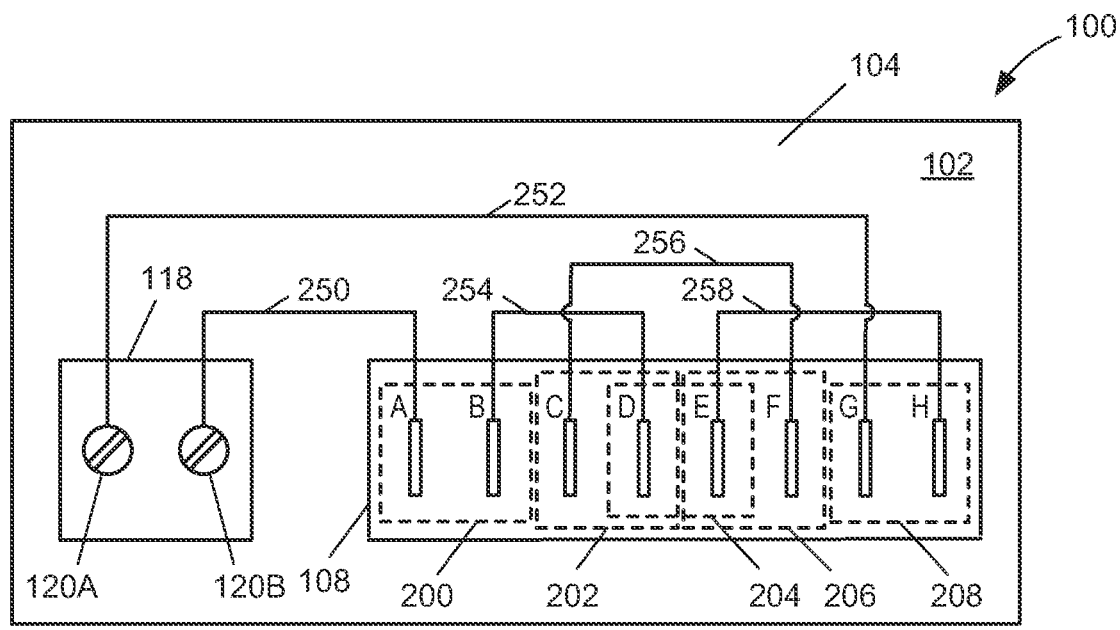
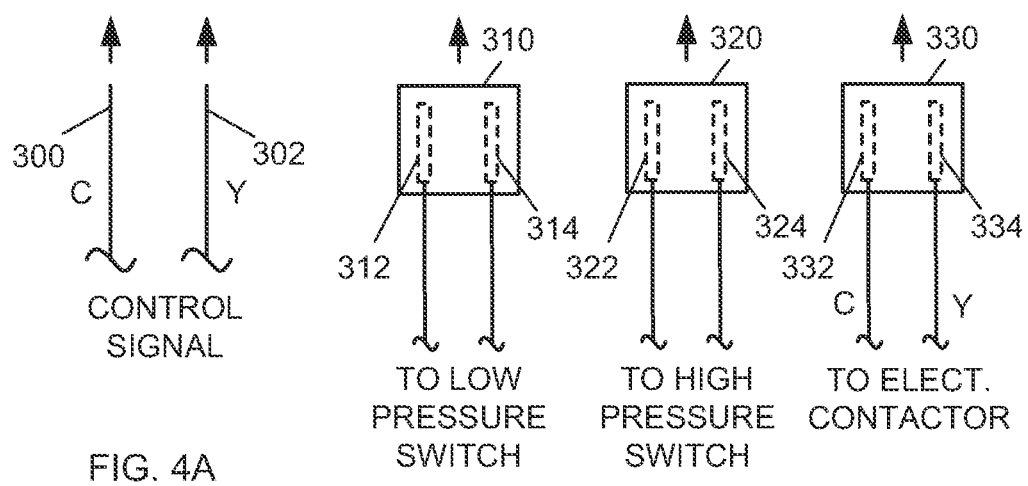
FIG. 4A

CONTROL SIGNAL ROUTING APPARATUS

BACKGROUND

1. Field of the Invention

The present invention relates to electrical signal routing apparatus and, more particularly, to apparatus for routing a control signal.

2. Description of Related Art

An electrical contactor is an electrically controlled switch used for selectively providing electrical power to one or more load devices. Contactors are used to control electric motors, lighting, heating, capacitor banks, thermal evaporators, and other electrical loads. A typical electrical contactor has control terminals for connecting to a magnetic coil, line terminals for connecting to conductors providing electrical power (i.e., line conductors), and load terminals for connecting to one or more load devices.

Larger heating, ventilating, and air conditioning (HVAC) systems usually include separate "high side" and "low side" units. The high side units are typically located outdoors, and include a compressor, a condenser coil, and a condenser fan. The low side units are typically located indoors, and include an evaporator coil and an evaporator fan. High side units typically include electrical contactors that supply electrical power to the compressor and the condenser fan motor in response to a control signal.

On high side units the control signal may be provided directly to the electrical contactor, or routed through one or more pressure and/or temperature switches. FIGS. 1A-1C illustrate some of ways the control signal may be routed. FIGS. 1A-1C show top plan views of a typical contactor 10 including line-side terminals 12A and 12B, load-side terminals 14A and 14B, a magnetic coil 16, and quick connect control signal terminals 18A and 18B connected to the magnetic coil 16. When an electrical current "I" flows through the magnetic coil 16, the contactor 10 is energized, the load-side terminal 14A is connected to the line-side terminal 12A, and the load-side terminal 14B is connected to the line-side terminal 12B.

FIG. 1A illustrates how a control signal may be routed directly to the control signal terminals of the contactor 10. The quick connect control signal terminal 18A is connected to a common connection "C," and the quick connect control signal terminal 18B is connected to an electrical voltage "Y" (e.g., from a thermostat). The electrical voltage "Y" formed between the quick connect control signal terminals 18A and 18B is the control signal. When the voltage "Y" is sufficient, the current "I" flows through the magnetic coil 16, and the contactor 10 is energized.

FIG. 1B illustrates how the control signal may be routed to the control signal terminals of the contactor 10 through a high pressure switch 20. The control signal terminal 18A is connected to the common connection "C," and the control signal terminal 18B is connected to the voltage "Y" via the high pressure switch 20 (shown in the closed position). The contactor 10 is energized when the voltage "Y" is sufficient and the high pressure switch 20 is in the closed position.

FIG. 1C illustrates how the control signal may be routed to the control signal terminals of the contactor 10 through the high pressure switch 20 and a low pressure switch 22. The control signal terminal 18A is connected to the common connection "C" via the low pressure switch 22 (shown in the closed position), and the control signal terminal 18B is connected to the voltage "Y" via the high pressure switch 20 (shown in the closed position). The contactor 10 is energized when the voltage "Y" is sufficient and the high pressure switch 20 is in the closed position and the low pressure switch 22 is in the closed position.

A problem arises in that the control signal is routed through different pressure switches on different systems, and the routing of the control signal is typically accomplished via electrical connections made by hand. If a wiring error is made when routing the control signal, such as during original system assembly or subsequent system repair, the wiring error may result in injury to a technician performing the work, damage to the contactor or one or more of the load devices, and/or create an unsafe operating condition.

SUMMARY

One embodiment of a disclosed control signal routing apparatus includes a substrate, a routing connector having multiple electrical terminals and multiple portions, and two or more electrical conductors positioned on or in the substrate. The routing connector is mounted on a surface of the substrate. The electrical terminals of the routing connector are arranged within a cavity of a housing. Each portion of the routing connector is adapted to receive a plug connector and includes at least two of the electrical terminals. The two or more electrical conductors are connected between electrical terminals of two different portions of the routing connector. Another embodiment of the apparatus includes the substrate, multiple routing connectors, a first set of one or more electrical conductor(s) positioned on or in the substrate, and a second set of one or more electrical conductor(s) positioned on or in the substrate. Each of the routing connectors includes a first, a second, and a third electrical terminals arranged within a cavity of a housing, and two portions each adapted to receive a plug connector. The routing connectors are ordered one after another to form a sequence. Each of the first set of electrical conductor(s) connects the first electrical terminal of one of the routing connectors to the first electrical terminal of a sequential next routing connector. Each of the second set of electrical conductor(s) connects the third electrical terminal of one of the routing connectors to the second electrical terminal of a sequential next routing connector.

BRIEF DESCRIPTION OF THE DRAWINGS

A better understanding of the various disclosed embodiments can be obtained when the detailed description is considered in conjunction with the following drawings, in which:

FIG. 3 is a top plan view of a routing connector of the control signal routing apparatus of FIG. 2;

FIG. 4A is a diagram of the control signal routing apparatus of FIG. 2 showing the electrical conductors of the routing apparatus, and illustrating how the routing apparatus may be used to route the control signal to an electrical contactor via a low pressure switch and a high pressure switch;

Figure 1A:
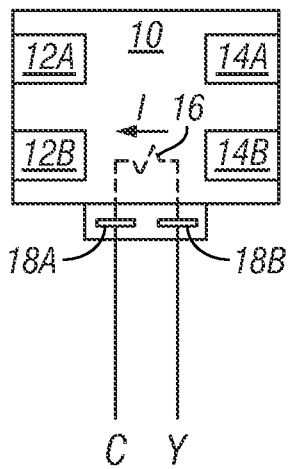
FIG. 1A is a top plan view of an electrical contactor illustrating how a control signal may be routed directly to control signal terminals of the contactor.
Figure 1B:
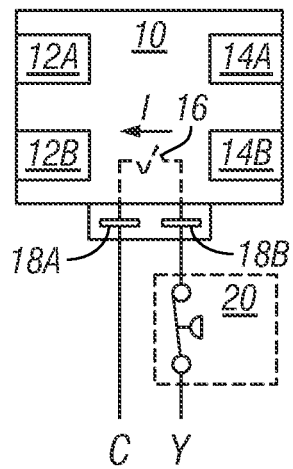
FIG. 1B is a top plan view of the electrical contactor of FIG. 1 illustrating how the control signal may be routed to the control signal terminals of the contactor through a high pressure switch.
Figure 1C:
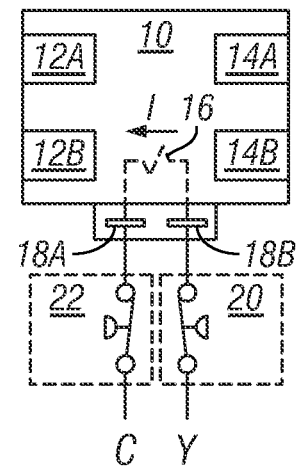
FIG. 1C is a top plan view of the electrical contactor of FIG. 1 illustrating how the control signal may be routed to the control signal terminals of the contactor through the high pressure switch and a low pressure switch.

While the invention is susceptible to various modifications and alternative forms, specific embodiments are shown by way of example in the drawings and will be described in detail. It should be understood, however, that the drawings and detailed description are not intended to limit the invention to the particular form disclosed, but on the contrary, the intention is to cover all modifications, equivalents and alternatives falling within the spirit and scope of the invention as defined by the appended claims.

DETAILED DESCRIPTION

Figure 2:
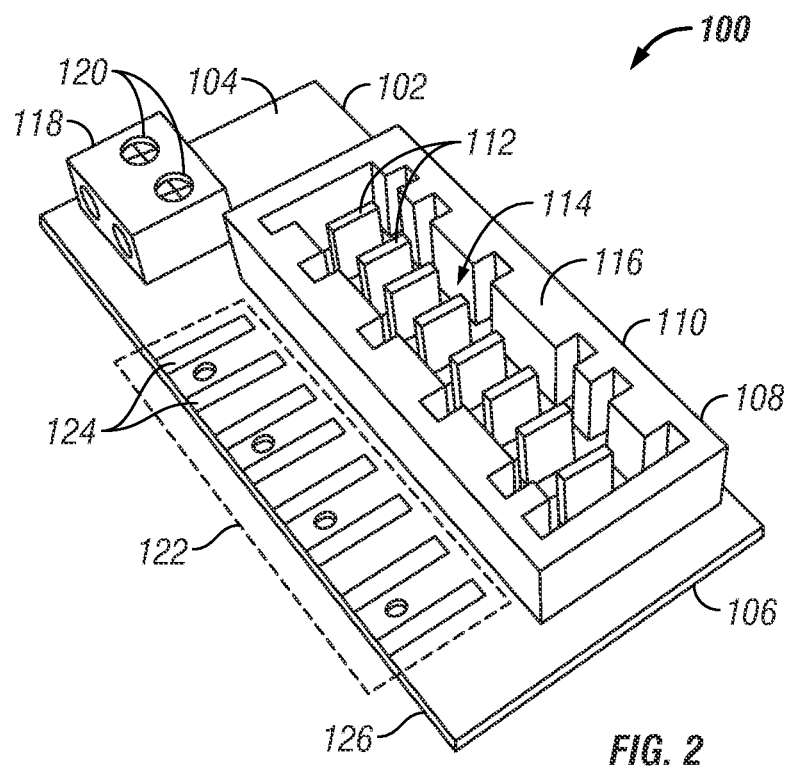
FIG. 2 is a perspective view of one embodiment of a control signal routing apparatus.

FIG. 2 is a perspective view of one embodiment of a control signal routing apparatus 100 that may include a substrate 102, a routing connector 108, and a control signal connector 118. The control signal routing apparatus 100 aids in routing the control signal, and helps eliminate wiring errors that may injure personnel, damage equipment, or create unsafe operating conditions.

In the embodiment of FIG. 2, the substrate 102 the substrate is formed from a substantially rigid and electrically insulating material (e.g., a cured resin), and has a substantially planar upper surface 104 and an opposed and substantially planar lower surface 106. The routing connector 108 is mounted on the mounted on the upper surface 104 and adapted for receiving and routing the control signal.

In the embodiment of FIG. 2, the routing connector 108 is a shrouded tab header connector having an insulative housing 110 with a cavity 114, and eight spaced apart tab terminals 112 arranged in the cavity 114 such that the tab terminals 112 are recessed within the cavity 114 with respect to an outer face 116 of the housing 110 (and the routing connector 108).

As described in more detail below (see FIG. 4A), the routing connector 108 has multiple portions each adapted to receive a plug connector. Each portion of the routing connector 108 includes at least two of the tab terminals 112 and a surrounding portion of the housing 110. The control signal routing apparatus 100 also includes one or more electrical conductors positioned on or in the substrate 102 and connected between electrical terminals of two different portions of the routing connector 108. The one or more electrical conductors allow the control signal to be routed through the two different portions of the routing connector.

In the embodiment of FIG. 2, the control signal is an electrical voltage signal. The control signal may be, for example, a direct current (DC) signal or an alternating current (AC) signal. The control signal may be used to energize an electrical contactor. The electrical contactor may be enabled when the control signal is present (or active), and may not be enabled when the control signal is absent (or inactive).

In the embodiment of FIG. 2, the control signal connector 118 is mounted on the upper surface 104 of the substrate 102, and includes two screw terminals 120. The control signal connector 118 receives the control signal via the screw terminals 120, and provides the control signal to the routing connector 108 via a pair of electrical conductors positioned on or in the substrate 102 (see FIG. 4A). In other embodiments, the terminals 120 may be or include other types of terminals such as spring terminals, plug-in terminals, quick connect terminals, or box lug terminals.

In the embodiment of FIG. 2, the control signal routing apparatus 100 includes an edge connector 122 positioned along a side surface 126 of the substrate 102. The edge connector 122 includes eight rectangular and spaced apart, electrically conductive pads 124 positioned on the upper surface 104 of the substrate 102 along the side surface 126. Each of the eight conductive pads 124 is connected to a corresponding one of the eight tab terminals 112 of the routing connector 108. The edge connector 122 may also include eight more conductive pads similar to the conductive pads 124 positioned on the lower surface 106 of the substrate 102 along the side surface 126. Another routing connector similar to the routing connector 108 may be connected to the substrate 102 via the edge connector 122.

FIG. 3 is a top plan view of the routing connector 108 of FIG. 2. In the embodiment of FIG. 3, the insulative housing 110 includes a base 150 and four walls extending from the base 150; an upper wall 152, a lower wall 154, and two side walls 156 and 158. The base 150, the upper wall 152, the two side walls 156 and 158, and the lower wall 154 form the cavity 114. There are eight spaced apart slots in the base 150, and the eight tab terminals 112 extend through the slots in the base 150. In FIG. 3, the eight tab terminals 112 are labeled "A," "B," "C," "D," "E," "F," "G," and "H" from left to right. The eight tab terminals 112 are recessed within the cavity 114 with respect to the outer face 116 of the housing 110 (and the routing connector 108).

As shown in FIG. 3, multiple keying and/or polarization slots 160 are formed in an inner surface 162 of the upper wall 152, and in an inner surface 164 of the lower wall 154. In the embodiment of FIG. 3, the routing connector 108 has multiple portions (see FIG. 4A and the description below). Each portion of the routing connector 108 has one or more keying and/or polarization slots 160, and the keying and/or polarization slots 160 are configured differently such that only corresponding plug connector(s) will fit in the portions of the routing connector 108.

In the embodiment of FIGS. 2-3, the tab terminals 112 include flat, rectangular mating "tab" portions made of an electrically conductive material (e.g., a metal), and are male terminals adapted to engage corresponding female terminals (e.g., of a plug connector). Other configurations of the tab terminals 112 are also possible. For example, in other embodiments the tab terminals 112 may be pin terminals, cylindrical "bullet" connectors adapted to engage corresponding female terminals, or female terminals adapted to engage corresponding male terminals (e.g., of a plug connector).

In the embodiment of FIGS. 2-3, the routing connector 108 conforms to the Raster Anschluss Steck Tecknik (RAST) standard for tab header connectors. In other embodiments the routing connector 108 may or may not conform to a header connector standard.

FIG. 4A is a diagram of the control signal routing apparatus 100 of FIG. 2 showing the electrical conductors of the routing apparatus 100, and illustrating how the routing apparatus 100 may be used to route the control signal to an electrical contactor via a low pressure switch and a high pressure switch. FIG. 4A illustrates the different portions of the routing connector 108 described above. In the embodiment of FIG. 4A, the routing connector 108 includes five different portions 200, 202, 204, 206, and 208, each of which is adapted to receive a plug connector. Each of the five portions 200, 202, 204, 206, and 208 includes two adjacent tab terminals 112 and a surrounding portion of the housing 110 of the routing connector 108 (see FIG. 3).

More specifically, the portion 200 includes the tab terminals "A" and "B" and a surrounding portion of the housing 110, the portion 202 includes the tab terminals "C" and "D" and a surrounding portion of the housing 110, and the portion 204 includes the tab terminals "D" and "E" and a surrounding portion of the housing 110. The portion 206 includes the tab terminals "E" and "F" and a surrounding portion of the housing 110, and the portion 204 includes the tab terminals "F" and "G" and a surrounding portion of the housing 110. Each of the portions 200, 202, 204, 206, and 208 has one or more keying and/or polarization slots 160 (see FIG. 3), and the keying and/or polarization slots 160 are configured differently such that only corresponding plug connector(s) will fit in the portions 200, 202, 204, 206, and 208. In the embodiment of FIG. 4A, some of the portions 200, 202, 204, 206, and 208 overlap one another, and others do not.

In FIG. 4A, the two screw terminals 120 of the control signal connector 118 are labeled "120A" and "120B." An electrical conductor 250 is connected between the screw terminal 120B of the control signal connector 118 and the tab terminal "A" of the routing connector 108, and another electrical conductor 252 is connected between the screw terminal 120A of the control signal connector and the tab terminal "G" of the routing connector 108. A third electrical conductor 254 is connected between the tab terminals "B" and "D" of the routing connector 108, a fourth electrical conductor 256 is connected between the tab terminals "C" and "F" of the routing connector 108, and a fifth electrical conductor 258 is connected between the tab terminals "E" and "H" of the routing connector 108. The electrical conductors 250 and 252 are used to route the control signal from the control signal connector 118 to the routing connector 108, and the electrical conductors 254, 256, and 258 allow the control signal to be routed through the different portions 200, 202, 204, 206, and 208 of the routing connector 108.

In the embodiment of FIG. 4A, the electrical conductors 250, 252, 254, 256, and 258 are formed on or in the substrate 102. For example, the substrate 102 may be a printed circuit board or printed wiring board, and the electrical conductors 250, 252, 254, 256, and 258 may be electrically conductive traces formed on the upper surface 104 of the substrate 102 and/or the lower surface 106 of the substrate 102 (e.g., by selectively removing portions of layer(s) of electrically conductive material(s) formed on the upper surface 104 and/or the lower surface 106). Alternately, or in addition, some or all of the electrical conductors 250, 252, 254, 256, and 258 may be electrically conductive traces or wires positioned on the upper surface 104, on the lower surface 106, or embedded within the substrate 102.

In the embodiment of FIG. 4A, the control signal is a voltage signal conveyed by a pair of electrical wires 300 and 302. The wire 300 is connected to a common electrical voltage level "C," and the wire 302 is connected to an electrical voltage "Y" (e.g., from a thermostat). The electrical voltage "Y" formed between the electrical wires 300 and 302 is the control signal. The screw terminal 120A of the control signal connector 118 is adapted to receive the wire 300, and the make physical and electrical contact with the wire 300. Similarly, the screw terminal 120B of the control signal connector 118 is adapted to receive the wire 302, and the make physical and electrical contact with the wire 302.

FIG. 4A illustrates how several plug connectors can be inserted into corresponding portions of the routing connector 108 to route the control signal to an electrical contactor via a low pressure switch and a high pressure switch. In the embodiment of FIG. 4A, the portion 200 of the routing connector 108 is adapted to receive a plug connector 310 of a low pressure switch. More specifically, the plug connector 310 of the low pressure switch has one or more ridges on an outer surface that mate with the one or more keying and/or polarization slots 160 (see FIG. 3) of the portion 200 of the routing connector 108 such that the plug connector 310 of the low pressure switch will physically fit in the portion 200.

The plug connector 310 of the low pressure switch includes two female terminals 312 and 314 arranged to make physical and electrical contact with two adjacent tab terminals 112 (see FIGS. 2 and 3) of the routing connector 108. The female terminals 312 and 314 are connected to two terminals of the low pressure switch such that the female terminals 312 and 314 are electrically isolated from one another when the low pressure switch is open, and electrically connected to one another when the low pressure switch is closed. When the plug connector 310 of the low pressure switch is inserted into the portion 200, the female terminals 312 and 314 of the plug connector 310 make physical and electrical contact with the two adjacent tab terminals "A" and "B" of the portion 200 of the routing connector 108.

In the embodiment of FIG. 4A, the portion 204 of the routing connector 108 is adapted to receive a plug connector 320 of a high pressure switch. More specifically, the plug connector 320 of the high pressure switch has one or more ridges on an outer surface that mate with the one or more keying and/or polarization slots 160 (see FIG. 3) of the portion 204 of the routing connector 108 such that the plug connector 320 of the high pressure switch will physically fit in the portion 204.

The plug connector 320 of the high pressure switch includes two female terminals 322 and 324 arranged to make physical and electrical contact with two adjacent tab terminals 112 (see FIGS. 2 and 3) of the routing connector 108. The female terminals 322 and 324 are connected to two terminals of the high pressure switch such that the female terminals 322 and 324 are electrically isolated from one another when the high pressure switch is open, and electrically connected to one another when the high pressure switch is closed. When the plug connector 320 of the high pressure switch is inserted into the portion 204, the female terminals 322 and 324 of the plug connector 320 make physical and electrical contact with the two adjacent tab terminals "D" and "E" of the portion 204 of the routing connector 108.

In the embodiment of FIG. 4A, the portion 208 of the routing connector 108 is adapted to receive a plug connector 330 of an electrical contactor. More specifically, the plug connector 330 of the electrical contactor has one or more ridges on an outer surface that mate with the one or more keying and/or polarization slots 160 (see FIG. 3) of the portion 208 of the routing connector 108 such that the plug connector 330 of the electrical contactor will physically fit in the portion 208.

The plug connector 330 of the electrical contactor includes two female terminals 332 and 334 arranged to make physical and electrical contact with two adjacent tab terminals 112 (see FIGS. 2 and 3) of the routing connector 108. The female terminals 332 and 334 are connected to two control signal terminals (e.g., control relay terminals) of the electrical contactor. When the plug connector 330 of the electrical contactor is inserted into the portion 208, the female terminals 332 and 334 of the plug connector 330 make physical and electrical contact with the two adjacent tab terminals "G" and "H" of the portion 208 of the routing connector 108.

In the embodiment of FIG. 4A, when the wires 300 and 302 conveying the control signal are inserted into the corresponding terminals 120A and 120B of the control signal connector 118, the plug connector 310 of the low pressure switch is inserted into the portion 200, the plug connector 320 of the high pressure switch is inserted into the portion 204, and the plug connector 330 of the electrical contactor is inserted into the portion 208, the control signal routing apparatus 100 routes the control signal to the electrical contactor via the low pressure switch and the high pressure switch. The electrical conductors 254 and 258 connect the low pressure switch, the high pressure switch, and the electrical contactor in series such that control signal is provided to the electrical contactor when the control signal is present (or active), the low pressure switch is closed, and the high pressure switch is closed.

In other embodiments, the portion 200 of the routing connector 108 may be adapted to receive the plug connector 320 of the high pressure switch, or a plug connector of the another type of electrical switch (e.g., a high/low temperature switch or a manual switch), and the portion 204 of the routing connector 108 may be adapted to receive the plug connector 310 of the low pressure switch, or a plug connector of the another type of electrical switch (e.g., a high/low temperature switch or a manual switch).

Figure 4B:
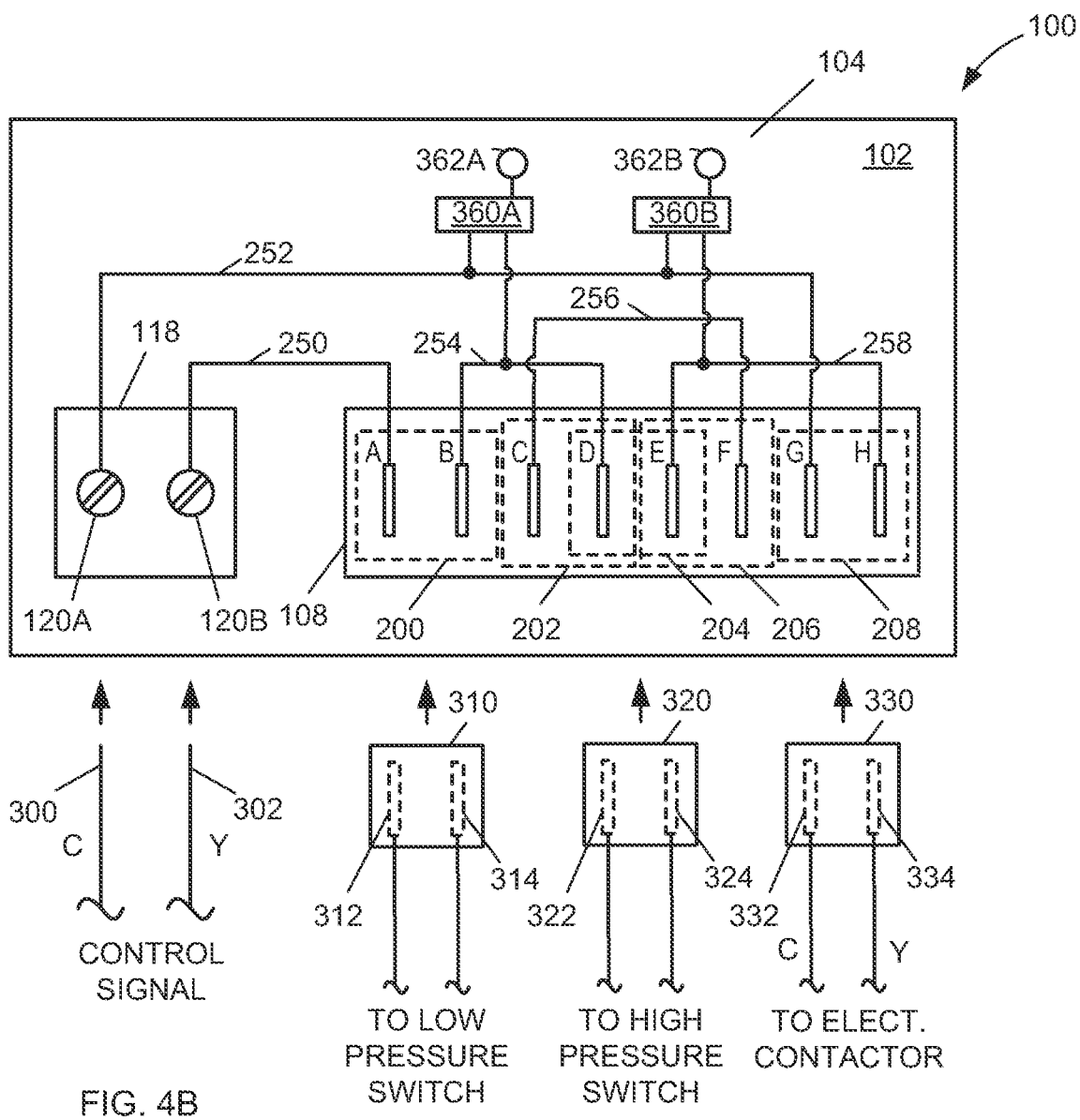
FIG. 4B is a diagram of another embodiment of the control signal routing apparatus of FIG. 4A including optional lighted indicators and associated optional indicator control circuits useful in determining whether certain electrical conductors are receiving the control voltage.

FIG. 4B is a diagram of another embodiment of the control signal routing apparatus 100 of FIG. 4A including optional lighted indicators and associated optional indicator control circuits useful in determining whether the electrical conductor 254 and/or 258 is receiving the control voltage. In the embodiment of FIG. 4B, the routing apparatus 100 includes an optional indicator control circuit 360A coupled between the electrical conductors 252 and 254, and an optional lighted indicator 362A coupled to the indicator control 360A. The indicator control circuit 360A controls the lighted indicator 362A dependent on the magnitude of an electrical voltage between the electrical conductors 252 and 254. The indicator control circuit 360A causes the lighted indicator 362A to illuminate (i.e., emit light) when the control signal is present between the electrical conductors 252 and 254. When the wires 300 and 302 conveying the control signal are inserted into the corresponding terminals 120A and 120B of the control signal connector 118, the plug connector 310 of the low pressure switch is inserted into the portion 200 of the routing connector 108, and the control signal is present (or active), the lighted indicator 362A is expectedly illuminated when the low pressure switch is closed, and not illuminated when the low pressure switch is open. The lighted indicator 362A may be or include, for example, a light emitting diode (LED), and the indicator control circuit 360A may be or include a resistor that limits a flow of electrical current through the lighted indicator 362A.

In the embodiment of FIG. 4B, the routing apparatus 100 also includes an optional indicator control circuit 360B coupled between the electrical conductors 252 and 258, and an optional lighted indicator 362B coupled to the indicator control 360B. The indicator control circuit 360B is similar to the indicator control circuit 360A, and the lighted indicator 362B is similar to the lighted indicator 362A. The indicator control circuit 360B controls the lighted indicator 362B dependent on the magnitude of an electrical voltage between the electrical conductors 252 and 258. The indicator control circuit 360B causes the lighted indicator 362B to illuminate (i.e., emit light) when the control signal is present between the electrical conductors 252 and 258. When the wires 300 and 302 conveying the control signal are inserted into the corresponding terminals 120A and 120B of the control signal connector 118, the plug connector 310 of the low pressure switch is inserted into the portion 200 of the routing connector 108 and the plug connector 320 of the high pressure switch is inserted into the portion 204 of the routing connector 108, and the control signal is present (or active), the lighted indicator 362B is expectedly illuminated when both the low pressure switch and the high pressure switch are closed, and not illuminated when either the low pressure switch or the high pressure switch is open.

Figure 5:
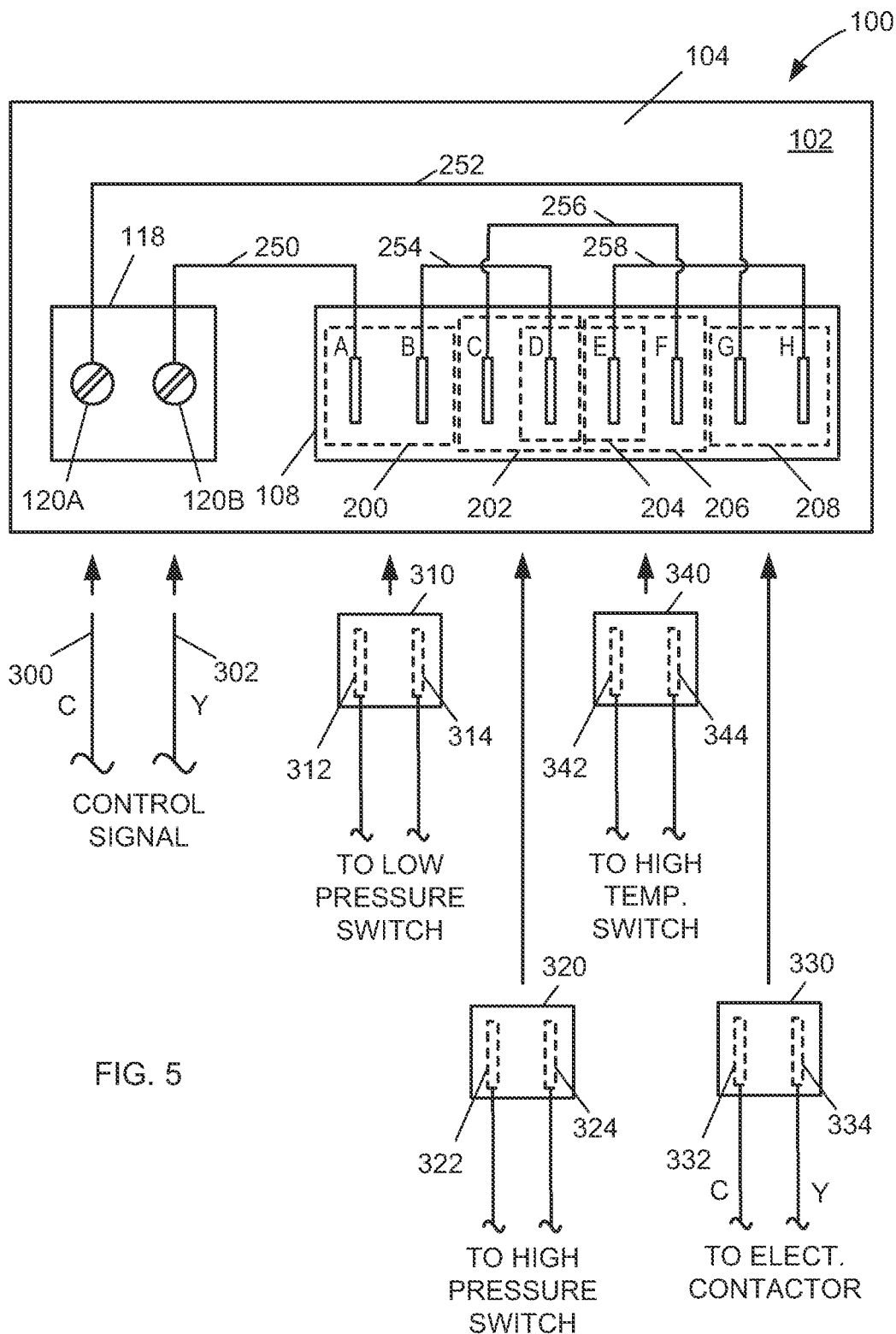
FIG. 5 is a diagram illustrating how the control signal routing apparatus of FIG. 4A can be used to route the control signal to the electrical contactor via the low pressure switch, the high pressure switch, and a high temperature switch.

FIG. 5 is a diagram illustrating how the control signal routing apparatus 100 of FIG. 4A can be used to route the control signal to the electrical contactor via the low pressure switch, the high pressure switch, and a high temperature switch. In the embodiment of FIG. 5, the portion 200 of the routing connector 108 is adapted to receive a plug connector 310 of a low pressure switch as described above. The portion 202 of the routing connector 108 is adapted to receive the plug connector 320 of the high pressure switch. More specifically, the one or more ridges on the outer surface the plug connector 320 mate with the one or more keying and/or polarization slots 160 (see FIG. 3) of the portion 202 of the routing connector 108 such that the plug connector 320 of the high pressure switch will physically fit in the portion 202. When the plug connector 320 of the high pressure switch is inserted into the portion 202, the female terminals 322 and 324 of the plug connector 320 make physical and electrical contact with the two adjacent tab terminals "C" and "D" of the portion 202 of the routing connector 108.

In the embodiment of FIG. 5, the portion 206 of the routing connector 108 is adapted to receive a plug connector 340 of a high temperature switch. More specifically, the plug connector 340 of the high temperature switch has one or more ridges on an outer surface that mate with the one or more keying and/or polarization slots 160 (see FIG. 3) of the portion 206 of the routing connector 108 such that the plug connector 340 of the high temperature switch will physically fit in the portion 206.

The plug connector 340 of the high temperature switch includes two female terminals 342 and 344 arranged to make physical and electrical contact with two adjacent tab terminals 112 (see FIGS. 2 and 3) of the routing connector 108. The female terminals 342 and 344 are connected to two terminals of the high temperature switch such that the female terminals 342 and 344 are electrically isolated from one another when the high temperature switch is open, and electrically connected to one another when the high temperature switch is closed. When the plug connector 340 of the high temperature switch is inserted into the portion 206, the female terminals 342 and 344 of the plug connector 340 make physical and electrical contact with the two adjacent tab terminals "E" and "F" of the portion 206 of the routing connector 108.

In the embodiment of FIG. 5, the portion 208 of the routing connector 108 is adapted to receive the plug connector 330 of the electrical contactor as described above. When the wires 300 and 302 conveying the control signal are inserted into the corresponding terminals 120A and 120B of the control signal connector 118, the plug connector 310 of the low pressure switch is inserted into the portion 200, the plug connector 320 of the high pressure switch is inserted into the portion 202, the plug connector 340 of the high temperature switch is inserted into the portion 206, and the plug connector 330 of the electrical contactor is inserted into the portion 208, the control signal routing apparatus 100 routes the control signal to the electrical contactor via the low pressure switch, the high pressure switch, and the high temperature switch. The electrical conductors 254, 256, and 258 connect the low pressure switch, the high pressure switch, the high temperature switch, and the electrical contactor in series such that control signal is provided to the electrical contactor when the control signal is present (or active), the low pressure switch is closed, the high pressure switch is closed, and the high temperature switch is closed.

In other embodiments, the portion 200 of the routing connector 108 may be adapted to receive the plug connector 320 of the high pressure switch, or a plug connector of the another type of electrical switch (e.g., a high/low temperature switch or a manual switch), and the portion 202 of the routing connector 108 may be adapted to receive the plug connector 310 of the low pressure switch, or a plug connector of the another type of electrical switch (e.g., a high/low temperature switch or a manual switch). The portion 206 of the routing connector 108 may be adapted to receive the plug connector of the another type of electrical switch (e.g., a high/low pressure switch or a manual switch).

Figure 6:
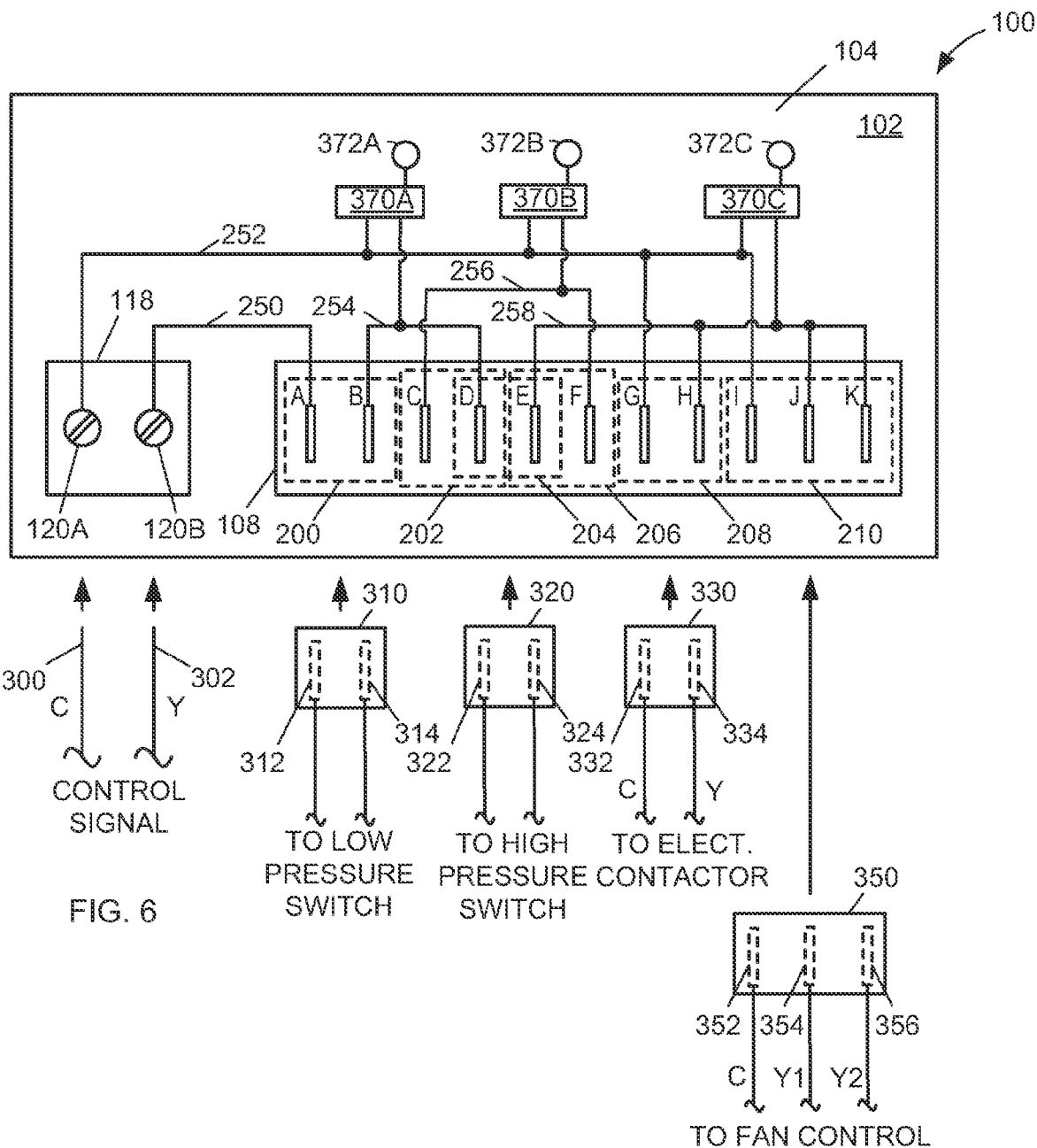
FIG. 6 is a diagram of another embodiment of the of the control signal routing apparatus of FIG. 2 illustrating how the routing apparatus may be used to route the control signal to an electrical contactor and a fan motor control unit via a low pressure switch and a high pressure switch.

FIG. 6 is a diagram of another embodiment of the of the control signal routing apparatus 100 of FIG. 2 showing the electrical conductors of the routing apparatus 100, and illustrating how the routing apparatus 100 may be used to route the control signal to an electrical contactor and a fan motor control unit via a low pressure switch and a high pressure switch. The embodiment of FIG. 6 is an extension of the embodiment of FIG. 4A, and elements shown in FIG. 4A and described above are labeled similarly in FIG. 6. In the embodiment of FIG. 6, the routing connector 108 includes the portions 200, 202, 204, 206, and 208 described above, and an additional portion 210. The portion 210 includes three additional tab terminals "I," "J," and "K," and a surrounding portion of the housing 110 (see FIG. 3). The portions 200, 202, 204, 206, 208, and 210 have one or more keying and/or polarization slots 160 (see FIG. 3), and the keying and/or polarization slots 160 are configured differently such that only corresponding plug connector(s) will fit in the portions 200, 202, 204, 206, 208, and 210. In the embodiment of FIG. 6, some of the portions 200, 202, 204, 206, 208, and 210 overlap one another, and others do not.

In the embodiment of FIG. 6, the portion 210 of the routing connector 108 is adapted to receive a plug connector 350 of a fan motor control unit. More specifically, the one or more ridges on the outer surface the plug connector 350 mate with the one or more keying and/or polarization slots 160 (see FIG. 3) of the portion 210 of the routing connector 108 such that the plug connector 350 of the fan motor control unit will physically fit in the portion 210. When the plug connector 350 of the fan motor control unit is inserted into the portion 210, female terminals 352, 354, and 356 of the plug connector 350 make physical and electrical contact with the tab terminals "I," "J," and "K," respectively, of the portion 210 of the routing connector 108.

In the embodiment of FIG. 6, the fan motor control unit receives a first "Y1" control signal as an electrical voltage signal between the tab terminal "J" of the routing connector 108 and the common electrical voltage level C at the tab terminal "I" of the routing connector 108, and a second "Y2" control signal as an electrical voltage signal between the tab terminal "K" of the routing connector 108 and the common electrical voltage level C at the tab terminal "I." The fan motor control unit operates a fan motor to run at a low speed and a high speed dependent upon the Y1 control signal and the Y2 control signal. More specifically, when the Y1 control signal is present and the Y2 control signal is absent, the fan motor control unit controls the fan motor to run at the low speed. When both the Y1 and Y2 control signals are present, the fan motor control unit controls the fan motor to run at the high speed.

In the embodiment of FIG. 6, the electrical conductor 252 is connected between the screw terminal 120A of the control signal connector 118 and the tab terminals "G" and "I" of the routing connector 108, and the electrical conductor 258 is connected between the tab terminals "E," "H," "J," and "K" of the routing connector 108. When the wires 300 and 302 conveying the control signal are inserted into the corresponding terminals 120A and 120B of the control signal connector 118, the plug connector 310 of the low pressure switch is inserted into the portion 200, the plug connector 320 of the high pressure switch is inserted into the portion 204, the plug connector 330 of the electrical contactor is inserted into the portion 208, and the plug connector 350 of the fan motor control unit is inserted into the portion 210, the control signal routing apparatus 100 routes the control signal to the electrical contactor and the fan motor control unit via the low pressure switch and the high pressure switch. The electrical conductors 250, 254, and 258 connect the low pressure switch, the high pressure switch, and the electrical contactor in series such that control signal is provided to the electrical contactor when the control signal is present (or active), the low pressure switch is closed, and the high pressure switch is closed. The electrical conductors 250, 254, and 258 also connect the low pressure switch, the high pressure switch, and the fan motor control unit in series such that control signal is provided to the fan motor control unit as both the Y1 control signal and the Y2 control signal when the control signal is present (or active), the low pressure switch is closed, and the high pressure switch is closed.

In the embodiment of FIG. 6, the control signal routing apparatus 100 includes optional lighted indicators and associated optional indicator control circuits useful in determining whether the electrical conductor 254, 256, and/or 258 is receiving the control voltage. In the embodiment of FIG. 6, the routing apparatus 100 includes an optional indicator control circuit 370A coupled between the electrical conductors 252 and 254, and an optional lighted indicator 372A coupled to the indicator control 360A. The indicator control circuit 370A controls the lighted indicator 372A dependent on the magnitude of an electrical voltage between the electrical conductors 252 and 254. The indicator control circuit 370A causes the lighted indicator 372A to illuminate (i.e., emit light) when the control signal is present between the electrical conductors 252 and 254. When the wires 300 and 302 conveying the control signal are inserted into the corresponding terminals 120A and 120B of the control signal connector 118, the plug connector 310 of the low pressure switch is inserted into the portion 200 of the routing connector 108, and the control signal is present (or active), the lighted indicator 372A is expectedly illuminated when the low pressure switch is closed, and not illuminated when the low pressure switch is open. The lighted indicator 372A may be or include, for example, a light emitting diode (LED), and the indicator control circuit 370A may be or include a resistor that limits a flow of electrical current through the lighted indicator 372A.

In the embodiment of FIG. 6, the routing apparatus 100 also includes an optional indicator control circuit 370B coupled between the electrical conductors 252 and 256, and an optional lighted indicator 372B coupled to the indicator control 370B. The indicator control circuit 370B is similar to the indicator control circuit 370A, and the lighted indicator 372B is similar to the lighted indicator 372A. The indicator control circuit 370B controls the lighted indicator 372B dependent on the magnitude of an electrical voltage between the electrical conductors 252 and 256. The indicator control circuit 370B causes the lighted indicator 372B to illuminate (i.e., emit light) when the control signal is present between the electrical conductors 252 and 256. The optional indicator control circuit 370B and lighted indicator 372B are used when a low pressure switch, a high pressure switch, and a high temperature switch are used to route the control signal to the electrical contactor and the fan motor control unit. Referring to both FIGS. 5 and 6, when the wires 300 and 302 conveying the control signal are inserted into the corresponding terminals 120A and 120B of the control signal connector 118, the plug connector 310 of the low pressure switch is inserted into the portion 200 of the routing connector 108, the plug connector 320 of the high pressure switch is inserted into the portion 202 of the routing connector 108 (see FIG. 5), the plug connector 340 of the high temperature switch is inserted into the portion 206 of the routing connector 108 (see FIG. 5), and the control signal is present (or active), the lighted indicator 372B is expectedly illuminated when the low pressure switch, the high pressure switch, and the high temperature switch are all closed, and not illuminated when the low pressure switch, and high pressure switch, and/or the high temperature switch is open.

In the embodiment of FIG. 6, the routing apparatus 100 also includes an optional indicator control circuit 370C coupled between the electrical conductors 252 and 258, and an optional lighted indicator 372C coupled to the indicator control 370C. The indicator control circuit 370C is similar to the indicator control circuits 370A and 370B, and the lighted indicator 372C is similar to the lighted indicators 372A and 372B. The indicator control circuit 370C controls the lighted indicator 372C dependent on the magnitude of an electrical voltage between the electrical conductors 252 and 258. The indicator control circuit 370C causes the lighted indicator 372C to illuminate (i.e., emit light) when the control signal is present between the electrical conductors 252 and 258. When the wires 300 and 302 conveying the control signal are inserted into the corresponding terminals 120A and 120B of the control signal connector 118, the plug connector 310 of the low pressure switch is inserted into the portion 200 of the routing connector 108, the plug connector 320 of the high pressure switch is inserted into the portion 204 of the routing connector 108, and the control signal is present (or active), the lighted indicator 372B is expectedly illuminated when both the low pressure switch and the high pressure switch are closed, and not illuminated when either the low pressure switch or the high pressure switch is open.

Figure 7:
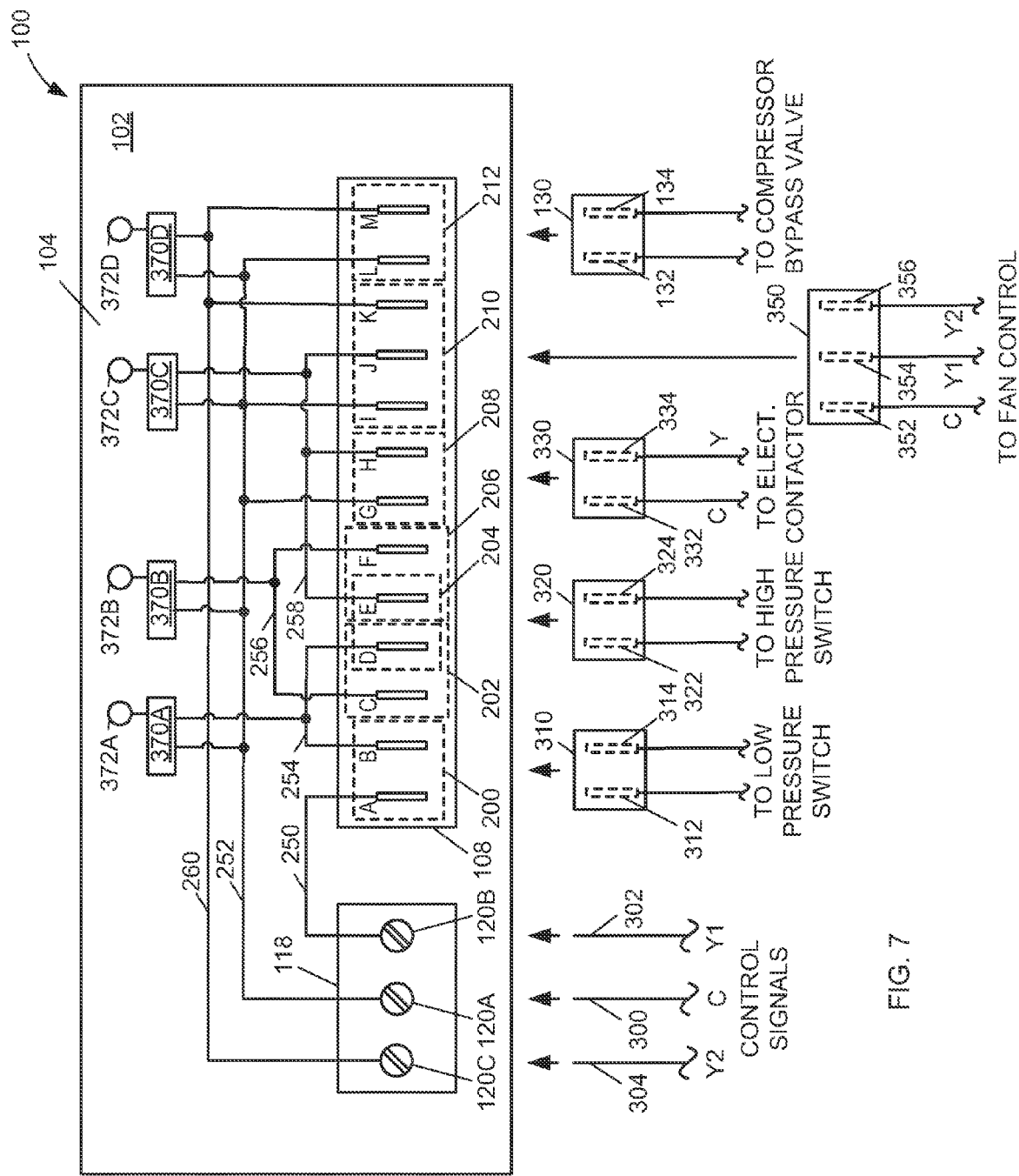
FIG. 7 is a diagram of another embodiment of the of the control signal routing apparatus of FIG. 2 illustrating how the routing apparatus may be used to route a first control signal to an electrical contactor and to a fan motor control unit via a low pressure switch and a high pressure switch, and a second control signal to the fan motor control unit and a compressor bypass valve.

FIG. 7 is a diagram of another embodiment of the of the control signal routing apparatus 100 of FIG. 2 showing the electrical conductors of the routing apparatus 100, and illustrating how the routing apparatus 100 may be used to route a first "Y1" control signal to an electrical contactor and to a fan motor control unit via a low pressure switch and a high pressure switch, and a second "Y2" control signal to the fan motor control unit and a compressor bypass valve. The embodiment of FIG. 7 is an extension of the embodiment of FIG. 6, and elements shown in FIG. 6 and described above are labeled similarly in FIG. 7. In the embodiment of FIG. 7, the routing connector 108 includes the portions 200, 202, 204, 206, 208, and 210 described above, and an additional portion 212. The portion 212 includes two additional tab terminals "L" and "M," and a surrounding portion of the housing 110 (see FIG. 3). The portions 200, 202, 204, 206, 208, 210, and 212 have one or more keying and/or polarization slots 160 (see FIG. 3), and the keying and/or polarization slots 160 are configured differently such that only corresponding plug connector(s) will fit in the portions 200, 202, 204, 206, 208, 210, and 212. In the embodiment of FIG. 7, some of the portions 200, 202, 204, 206, 208, 210, and 212 overlap one another, and others do not.

In the embodiment of FIG. 7, the portion 212 of the routing connector 108 is adapted to receive a plug connector 130 of a compressor bypass valve. More specifically, the one or more ridges on the outer surface the plug connector 130 mate with the one or more keying and/or polarization slots 160 (see FIG. 3) of the portion 212 of the routing connector 108 such that the plug connector 130 of the compressor bypass valve will physically fit in the portion 212. When the plug connector 130 of the compressor bypass valve is inserted into the portion 212, female terminals 132 and 134 of the plug connector 130 make physical and electrical contact with the tab terminals "L" and "M," respectively, of the portion 212 of the routing connector 108.

In the embodiment of FIG. 7, the control signal connector 118 includes three screws terminals—the two screw terminals 120A and 120B described above, and a third screw terminal labeled "120C" in FIG. 7. A wire 304 is connected to the screw terminal 120C. The wires 300 and 302 convey the Y1 control signal, and the wires 300 and 304 convey the Y2 control signal. The Y1 control signal may be, for example, a first stage cooling control signal, and the Y2 control signal may be a second stage cooling control signal.

In the embodiment of FIG. 7, the electrical conductor 252 is connected between the screw terminal 120A of the control signal connector 118 and the tab terminals "G," "I," and "L" of the routing connector 108. An additional electrical conductor 260 is connected between the screw terminal 120C of the control signal connector 118 and the tab terminal "M" of the routing connector 108.

When the wires 300, 302, and 304 are inserted into the screw terminals 120A, 120B, and 120C of the control signal connector 118 as shown in FIG. 7, and the plug connector 130 of the compressor bypass valve is inserted into the portion 212 of the routing connector 108, the compressor bypass valve receives the Y2 control signal (e.g., a second stage cooling control signal). The compressor bypass valve may be, for example, open when the Y2 control signal is absent, allowing a portion of a refrigerant flow to enter a return line and decreasing mechanical and electrical loading of the compressor. When the Y2 control signal is present, the compressor bypass valve may be closed, preventing the portion of the refrigerant flow from entering the return line and increasing the mechanical and electrical loading of the compressor.

In the embodiment of FIG. 7, the fan motor control unit receives the Y1 control signal and the Y2 control signal, and operates the fan motor to run at a low speed and a high speed dependent upon the Y1 control signal and the Y2 control signal. More specifically, when the Y1 control signal is present and the Y2 control signal is absent, the fan motor control unit controls the fan motor to run at the low speed. When both the Y1 and Y2 control signals are present, the fan motor control unit controls the fan motor to run at the high speed.

In the embodiment of FIG. 7, the control signal routing apparatus 100 includes an optional lighted indicator 372D and an associated optional indicator control circuit 370D coupled between the electrical conductors 252 and 260. The indicator control circuit 370D controls the lighted indicator 372D dependent on the magnitude of an electrical voltage between the electrical conductors 252 and 260. The indicator control circuit 370D causes the lighted indicator 372D to illuminate (i.e., emit light) when the Y2 control signal is present between the electrical conductors 252 and 260. The lighted indicator 372D is expectedly illuminated when the Y2 control signal is present, and not illuminated when the Y2 control signal is absent. The lighted indicator 372D may be or include, for example, a light emitting diode (LED), and the indicator control circuit 370D may be or include a resistor that limits a flow of electrical current through the lighted indicator 372D.

Figure 8:
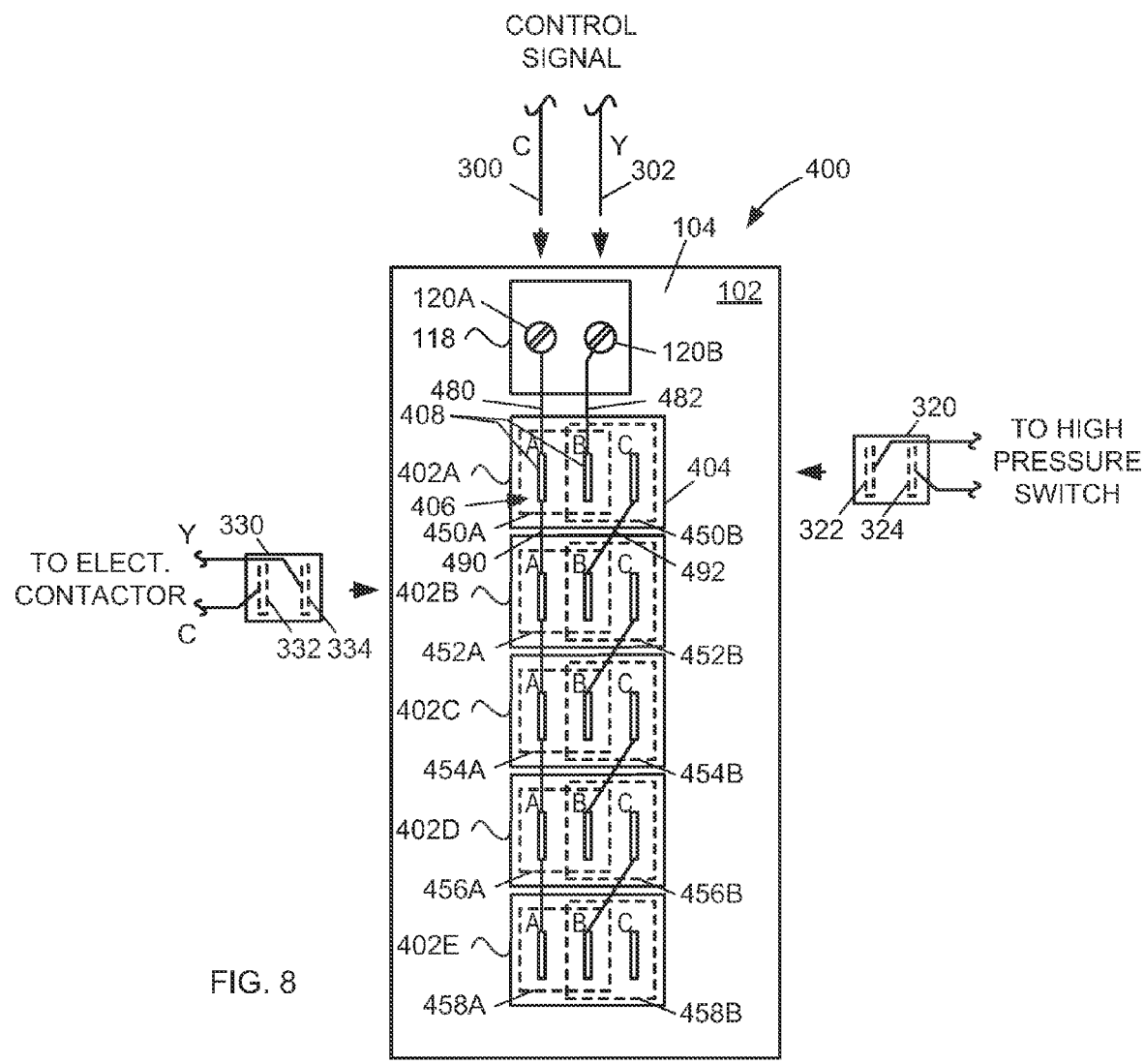
FIG. 8 is a diagram of another embodiment of the control signal routing apparatus showing electrical conductors of the routing apparatus, and illustrating how the routing apparatus may be used to route the control signal to the electrical contactor via the high pressure switch.

FIG. 8 is a diagram of another embodiment of the control signal routing apparatus, labeled "400" in FIG. 8, showing electrical conductors of the routing apparatus 400, and illustrating how the routing apparatus 400 may be used to route the control signal to the electrical contactor via the high pressure switch. Elements of the control signal routing apparatus 100 shown in FIGS. 2-5 and described above are labeled similarly in FIGS. 6-8. In the embodiment of FIG. 8, the control signal routing apparatus 400 includes the substrate 102, the control signal connector 118, and five routing connectors 402A-402E, referred to collectively as the routing connectors 402. In the embodiment of FIG. 8, the routing connectors 402 and the control signal connector 118 are mounted on the upper surface 104 of the substrate 102. Each of the routing connectors 402 is a shrouded header connector similar to the routing connector 108 shown in FIGS. 2-5 and described above.

As shown in FIG. 8, the routing connector 402A includes an insulative housing 404 with a cavity 406, and three spaced apart tab terminals 408 arranged in the cavity 406 such that the tab terminals 408 are recessed within the cavity 406 with respect to an outer face of the housing 404 (and the routing connector 402A). The other four routing connectors 402B-402E are substantially identical to the routing connector 402A. In FIG. 8, the three spaced apart tab terminals of each of the routing connectors 402B-402E are labeled "A," "B," and "C" from left to right.

In the embodiment of FIG. 8, each of the routing connectors 402 includes two portions each adapted to receive a plug connector, where a first portion includes the tab terminals "A" and "B" and a surrounding portion of the housing, and the second portion includes the tab terminals "B" and "C" and a surrounding portion of the housing. More specifically, the routing connector 402A includes two portions 450A and 450B each adapted to receive a plug connector. The portion 450A of the routing connector 402A includes the tab terminals "A" and "B" and a surrounding portion of the housing 404, and the portion 450B includes the tab terminals "B" and "C" and a surrounding portion of the housing 404. Each of the two portions 450A and 450B has one or more keying and/or polarization slots 160 (see FIG. 3), and the keying and/or polarization slots 160 are configured differently such that only corresponding plug connector(s) will fit in the portions 450A and 450B. The routing connector 402B includes two portions 452A and 452B, the routing connector 402C includes two portions 454A and 454B, and the routing connector 402D includes two portions 454A and 454B. The routing connector 402D includes two portions 456A and 456B, and the routing connector 402E includes two portions 458A and 458B.

In the embodiment of FIG. 8, the routing connectors 402 are ordered one after another to form a sequence. The sequence of the routing connectors 402 may be arbitrarily selected from the many possible ways of arranging the five routing connectors 402A-402E. In the embodiment of FIG. 8, the selected sequence of the routing connectors is: 402A, 402B, 402C, 402D, and 402E; many other sequences are possible.

In the embodiment of FIG. 8, each of the routing connectors 402 except the last routing connector 402E has a sequential next routing connector, where the sequential next routing connector is the next one of the routing connectors 402 in the sequence. For example, the routing connector 402B is the sequential next routing connector of the routing connector 402A, the routing connector 402C is the sequential next routing connector of the routing connector 402B, and so on.

In the embodiment of FIG. 8, the control signal routing apparatus 400 also includes an electrical conductor 480 connected between the screw terminal 120A of the control signal connector 118 and the tab terminal "A" of the routing connector 402A, and another electrical conductor 482 connected between the screw terminal 120B of the control signal connector and the tab terminal "B" of the routing connector 402A. As described above, the substrate 102 may be a printed circuit board or printed wiring board, and the electrical conductors of the control signal routing apparatus 400 may be electrically conductive traces formed on the upper surface 104 of the substrate 102 and/or the lower surface 106 of the substrate 102 (see FIG. 2). Alternately, or in addition, some or all of the electrical conductors of the control signal routing apparatus 400 may be electrically conductive traces or wires positioned on the upper surface 104, on the lower surface 106, or embedded within the substrate 102.

The control signal routing apparatus 400 of FIG. 8 also includes a first set of one or more electrical conductors each positioned on or in the substrate 102 and connecting the tab terminal "A" of one of the routing connectors to the tab terminal "A" of a sequential next one of the routing connectors. More specifically, in the embodiment of FIG. 8, the control signal routing apparatus 400 also includes an electrical conductor 490 positioned on or in the substrate 102 and connecting the tab terminal "A" of the routing connector 402A to the tab terminal "A" of the sequential next routing connector 402B. The control signal routing apparatus 400 also includes the similar electrical conductors shown in FIG. 8 connecting the tab terminal "A" of the routing connector 402B to the tab terminal "A" of the sequential next routing connector 402C, the tab terminal "A" of the routing connector 402C to the tab terminal "A" of the sequential next routing connector 402D, and the tab terminal "A" of the routing connector 402D to the tab terminal "A" of the sequential next routing connector 402E.

The control signal routing apparatus 400 of FIG. 8 also includes a second set of one or more electrical conductors each positioned on or in the substrate 102 and connecting the tab terminal "C" of one of the routing connectors 402 to the tab terminal "B" of a sequential next one of the routing connectors. More specifically, in the embodiment of FIG. 8, the control signal routing apparatus 400 also includes an electrical conductor 492 positioned on or in the substrate 102 and connecting the tab terminal "C" of the routing connector 402A to the tab terminal "B" of the sequential next routing connector 402B. The control signal routing apparatus 400 also includes the similar electrical conductors shown in FIG. 8 connecting the tab terminal "C" of the routing connector 402B to the tab terminal "B" of the sequential next routing connector 402C, the tab terminal "C" of the routing connector 402C to the tab terminal "B" of the sequential next routing connector 402D, and the tab terminal "C" of the routing connector 402D to the tab terminal "B" of the sequential next routing connector 402E.

In the embodiment of FIG. 8, the routing connectors 402 are arranged in a linear fashion on the upper surface 104 of the substrate 102 that reflects the selected sequence of the routing connectors 402. The linear arrangement shown in FIG. 8 is purely for convenience, and in other embodiments the routing connectors 402 may be arranged on the upper surface 104 in other ways.

In the embodiment of FIG. 8, each of the routing connectors 402 conforms to the Raster Anschluss Steck Tecknik (RAST) standard for tab header connectors. In other embodiments the routing connectors 402 may or may not conform to a header connector standard.

In the embodiment of FIG. 6, the portion 450A of the routing connector 402A, the portion 452A of the routing connector 402B, the portion 454A of the routing connector 402C, the portion 456A of the routing connector 402D, and the portion 458A of the routing connector 402E are all adapted as described above to receive the plug connector 330 of the electrical contactor. In addition, the portion 450B of the routing connector 402A, the portion 452B of the routing connector 402B, the portion 454B of the routing connector 402C, the portion 456B of the routing connector 402D, and the portion 458B of the routing connector 402E are all adapted as described above to receive the plug connector 310 of the low pressure switch, the plug connector 320 of the high pressure switch, or the plug connector 340 of the high temperature switch. In other embodiments, the portion 450B of the routing connector 402A, the portion 452B of the routing connector 402B, the portion 454B of the routing connector 402C, the portion 456B of the routing connector 402D, and the portion 458B of the routing connector 402E may be adapted to receive the plug connector of another type of electrical switch (e.g., a manual switch).

FIG. 8 will now be used to illustrate how the routing apparatus 400 may be used to route the control signal to the electrical contactor via the high pressure switch. As described above, the portion 450B of the routing connector 402A is adapted to receive the plug connector 310 of the low pressure switch, the plug connector 320 of the high pressure switch, or the plug connector 340 of the high temperature switch. The portion 452A of the routing connector 402B is adapted to receive the plug connector 330 of the electrical contactor. When the wires 300 and 302 conveying the control signal are inserted into the corresponding terminals 120A and 120B of the control signal connector 118, the plug connector 320 of the high pressure switch is inserted into the portion 450B of the routing connector 402A, and the plug connector 330 of the electrical contactor is inserted into the portion 452A of the routing connector 402B, the control signal routing apparatus 400 routes the control signal to the electrical contactor via the high pressure switch. The electrical conductors 480, 482, 490, and 492 connect the high pressure switch and the electrical contactor in series such that control signal is provided to the electrical contactor when the control signal is present (or active) and the high pressure switch is closed.

Figure 9:
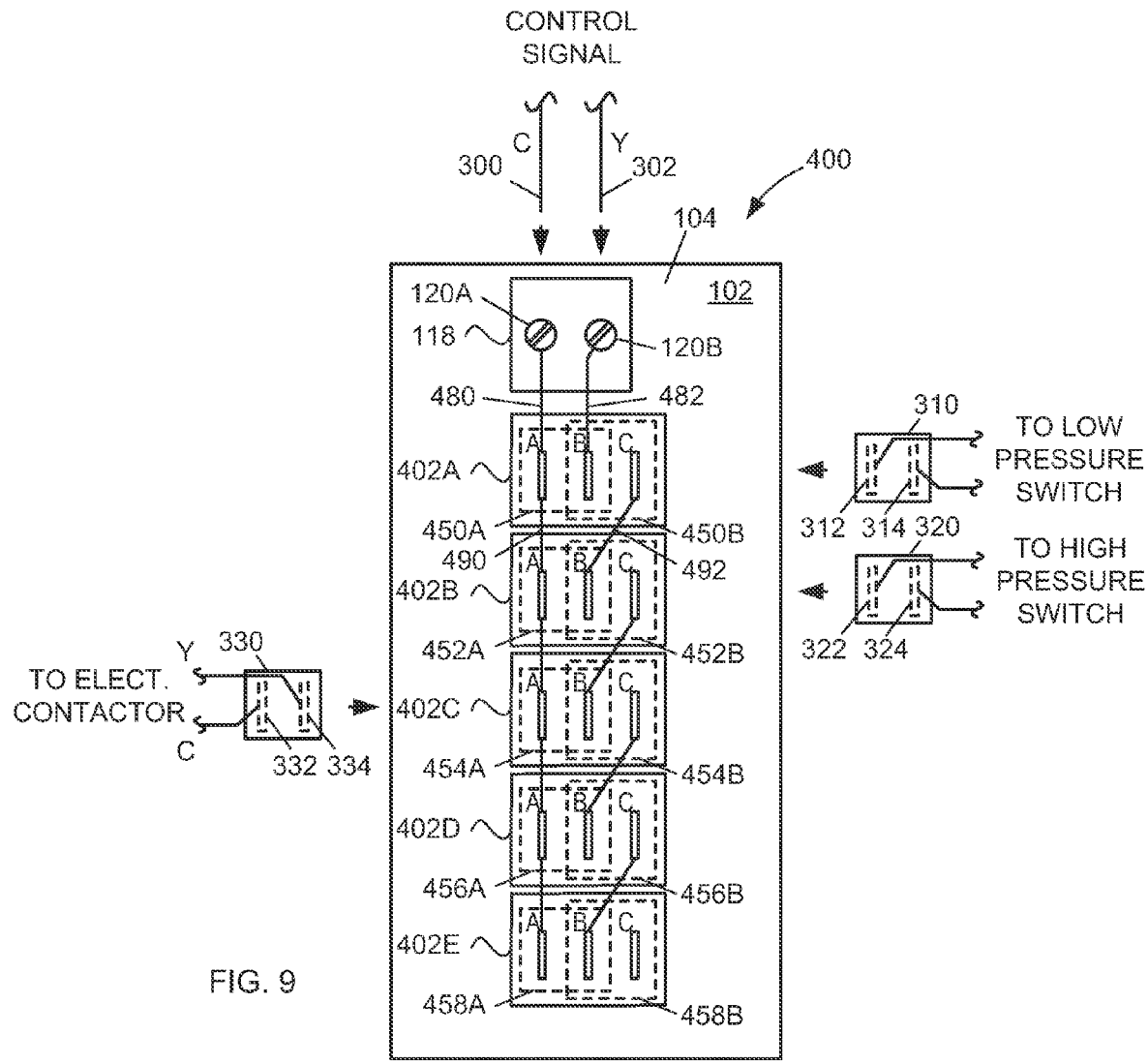
FIG. 9 is a diagram illustrating how the control signal routing apparatus of FIG. 8 may be used to route the control signal to the electrical contactor via the low pressure switch and the high pressure switch.

FIG. 9 is a diagram illustrating how the control signal routing apparatus 400 of FIG. 8 may be used to route the control signal to the electrical contactor via the low pressure switch and the high pressure switch. As described above, the portion 450B of the routing connector 402A and the portion 452B of the routing connector 402B are adapted to receive the plug connector 310 of the low pressure switch, the plug connector 320 of the high pressure switch, or the plug connector 340 of the high temperature switch. The portion 454A of the routing connector 402C is adapted to receive the plug connector 330 of the electrical contactor.

When the wires 300 and 302 conveying the control signal are inserted into the corresponding terminals 120A and 120B of the control signal connector 118, the plug connector 310 of the low pressure switch is inserted into the portion 450B of the routing connector 402A, the plug connector 320 of the high pressure switch is inserted into the portion 452B of the routing connector 402B, and the plug connector 330 of the electrical contactor is inserted into the portion 452A of the routing connector 402C, the control signal routing apparatus 400 routes the control signal to the electrical contactor via the low pressure switch and the high pressure switch. The electrical conductors 480, 482, 490, and 492, the electrical conductor connecting the tab terminal "A" of the routing connector 402B to the tab terminal "A" of the routing connector 402C, and the electrical conductor connecting the tab terminal "C" of the routing connector 402B to the tab terminal "B" of the routing connector 402C, connect the high pressure switch and the electrical contactor in series such that control signal is provided to the electrical contactor when the control signal is present (or active), the low pressure switch is closed, and the high pressure switch is closed.

Figure 10:
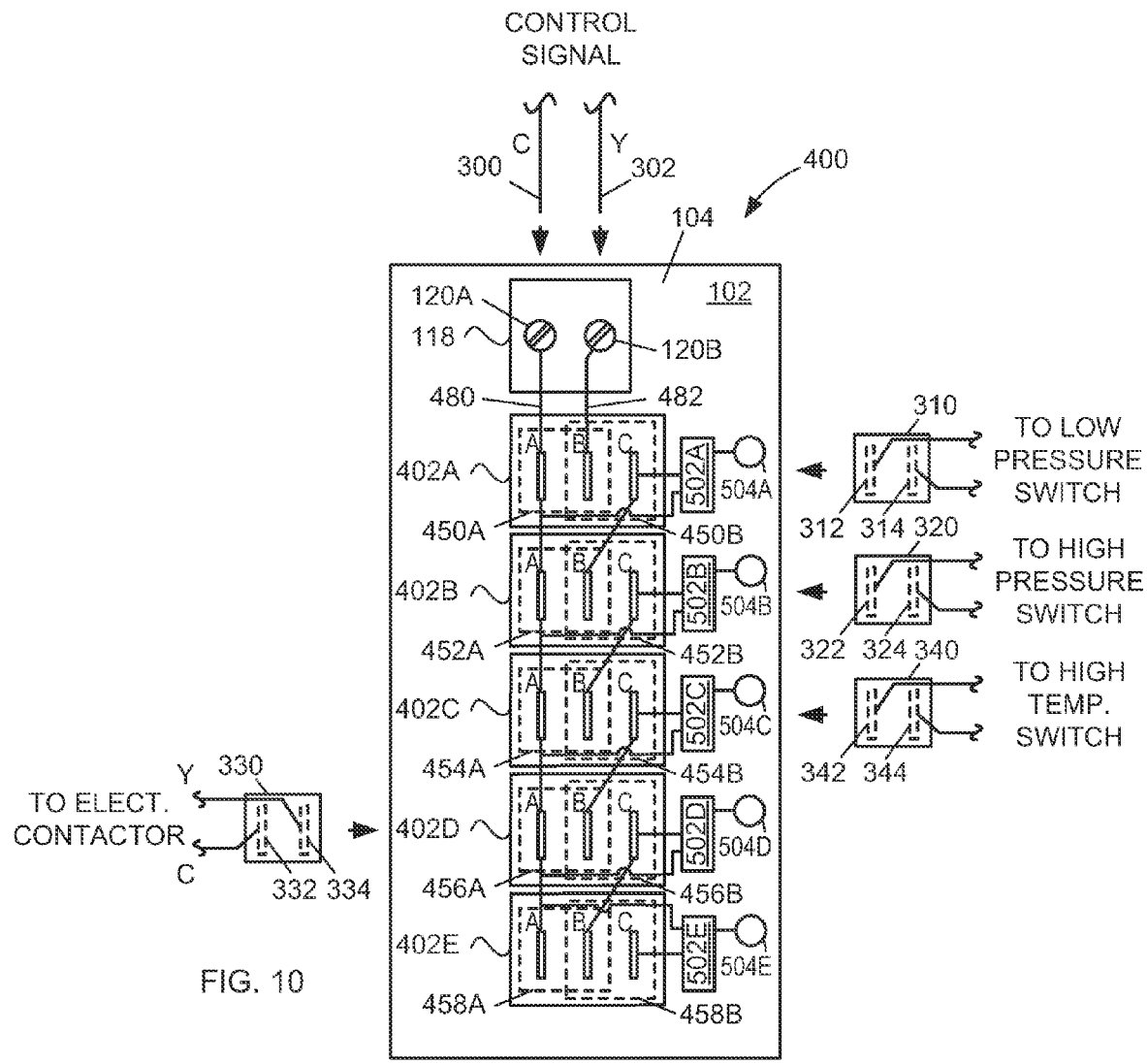
FIG. 10 is a diagram of another embodiment of the control signal routing apparatus of FIG. 8 illustrating how the routing apparatus may be used to route the control signal to the electrical contactor via the low pressure switch, the high pressure switch, and the high temperature switch.

FIG. 10 is a diagram of another embodiment of the control signal routing apparatus 400 of FIG. 8, and illustrates how the routing apparatus 400 may be used to route the control signal to the electrical contactor via the low pressure switch, the high pressure switch, and the high temperature switch. In the embodiment of FIG. 10, each of the five routing connectors 402 of the control signal routing apparatus 400 has a corresponding optional lighted indicator and a corresponding optional indicator control circuit. Each lighted indicator illuminates (i.e., emits light) when the control signal is present at the corresponding one of the routing connectors 402. The optional lighted indicators and associated optional indicator control circuits are thus useful in determining which of the routing connectors 402 are, and are not, receiving the control voltage.

More specifically, in the embodiment of FIG. 10, the routing apparatus 400 includes an optional indicator control circuit 502A coupled to the routing connector 402A, and an optional lighted indicator 504A coupled to the indicator control 502A. The indicator control circuit 502A is coupled to the tab terminals "A" and "C" of the routing connector 402A, and controls the lighted indicator 504A dependent on the magnitude of an electrical voltage between the tab terminals "A" and "C" of the routing connector 402A. The indicator control circuit 502A causes the lighted indicator 504A to illuminate (i.e., emit light) when the control signal is present between the tab terminals "A" and "C" of the routing connector 402A. The lighted indicator 504A may be or include, for example, a light emitting diode (LED), and the indicator control circuit 502A may be or include a resistor that limits a flow of electrical current through the lighted indicator 502A.

Optional indicator control circuits 502B, 502C, 502D, and 502E are respectively coupled to the tab terminals "A" and "C" of the corresponding routing connectors 402B, 402C, 402D, and 402E. Optional lighted indicators 504B, 504C, 504D, and 504E are respectively coupled to the corresponding indicator control circuits 502B, 502C, 502D, and 502E. In the embodiment of FIG. 10, the indicator control circuits 502B, 502C, 502D, and 502E are substantially identical to the indicator control circuit 502A, and the lighted indicators 504B, 504C, 504D, and 504E are substantially identical to the lighted indicator 502A. Each of the indicator control circuits 502A-502E causes the corresponding one of the lighted indicators 504A-504E to illuminate (i.e., emit light) when the control signal is present between the tab terminals "A" and "C" of the corresponding one of the routing connectors 402A-402E.

FIG. 10 will now be used to illustrate how the routing apparatus 400 may be used to route the control signal to the electrical contactor via the low pressure switch, the high pressure switch, and the high temperature switch. As described above, the portion 450B of the routing connector 402A, the portion 452B of the routing connector 402B, and the portion 454B of the routing connector 402C are adapted to receive the plug connector 310 of the low pressure switch, the plug connector 320 of the high pressure switch, or the plug connector 340 of the high temperature switch. The portion 456A of the routing connector 402D is adapted to receive the plug connector 330 of the electrical contactor.

When the wires 300 and 302 conveying the control signal are inserted into the corresponding terminals 120A and 120B of the control signal connector 118, the plug connector 310 of the low pressure switch is inserted into the portion 450B of the routing connector 402A, the plug connector 320 of the high pressure switch is inserted into the portion 452B of the routing connector 402B, the plug connector 340 of the high temperature switch is inserted into the portion 454B of the routing connector 402C, and the plug connector 330 of the electrical contactor is inserted into the portion 456A of the routing connector 402D, the control signal routing apparatus 400 routes the control signal to the electrical contactor via the low pressure switch, the high pressure switch, and the high temperature switch. Several of the electrical conductors, including the electrical conductors 480, 482, 490, and 492, connect the low pressure switch, the high pressure switch, the high temperature switch, and the electrical contactor in series such that control signal is provided to the electrical contactor when the control signal is present (or active), the low pressure switch is closed, the high pressure switch is closed, and the high temperature switch is closed.

Figure 11:
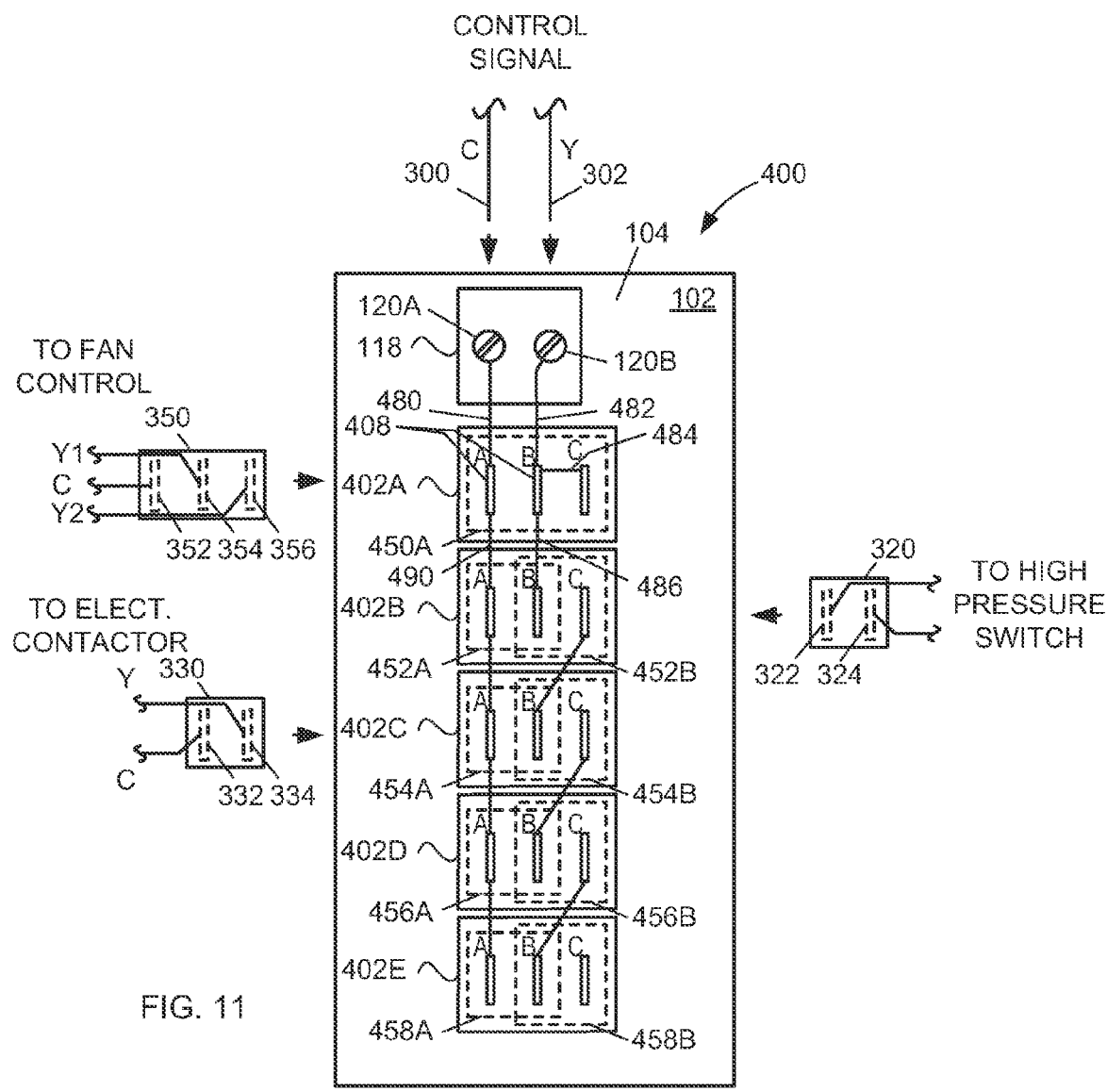
FIG. 11 is a diagram of another embodiment of the control signal routing apparatus of FIG. 8 illustrating how the routing apparatus may be used to route the control signal to a fan motor control unit, and to the electrical contactor via the high pressure switch.

FIG. 11 is a diagram of another embodiment of the control signal routing apparatus 400 of FIG. 8, and illustrates how the routing apparatus 400 may be used to route the control signal to a fan motor control unit, and to the electrical contactor via the high pressure switch. In the embodiment of FIG. 11, the portion 450A of the routing connector 402A includes the tab terminals "A," "B," and "C," and a surrounding portion of the housing, and is adapted to receive the plug connector 350 of the fan motor control unit. The portion 452B of the routing connector 402B is adapted to receive the plug connector 320 of the high pressure switch, and the portion 454A of the routing connector 402C are adapted to receive the plug connector 330 of the electrical contactor. An electrical conductor 484 is connected between the tab terminals "B" and "C" of the routing connector 402A, and an electrical conductor 486 is connected between the tab terminal "B" of the routing connector 402A and the tab terminal "B" of the routing connector 402B.

In the embodiment of FIG. 11, the fan motor control unit receives the Y1 control signal as an electrical voltage signal between the tab terminal "B" of the routing connector 402A and the common electrical voltage level C at the tab terminal "A" of the routing connector 402A, and the Y2 control signal as an electrical voltage signal between the tab terminal "C" of the routing connector 402A and the common electrical voltage level C at the tab terminal "A." The fan motor control unit operates the fan motor to run at the low speed when the Y1 control signal is present and the Y2 control signal is absent, and at the high speed when both the Y1 and Y2 control signals are present.

When the wires 300 and 302 conveying the control signal are inserted into the corresponding terminals 120A and 120B of the control signal connector 118, the plug connector 350 of the fan motor control unit is inserted into the portion 450A of the routing connector 402A, the plug connector 320 of the high pressure switch is inserted into the portion 452B of the routing connector 402B, and the plug connector 330 of the electrical contactor is inserted into the portion 454A of the routing connector 402C, the control signal routing apparatus 400 routes the control signal to the fan motor control unit, and to the electrical contactor via the high pressure switch. The fan motor control unit receives the control signal as the Y1 control signal via the electrical conductor 482, and as the Y2 control signal via the electrical conductor 484. The electrical connector 486 and other electrical conductors route the control signal through the high pressure switch and to the electrical contactor such that control signal is provided to the electrical contactor when the control signal is present (or active) and the high pressure switch is closed.

In other embodiments, one or more of the routing connectors 402A-402E of the control signal routing apparatus 400 may have corresponding optional lighted indicators and corresponding optional indicator control circuits similar to the lighted indicators 504A-E and the corresponding optional indicator control circuits 502A-E shown in FIG. 10 and described above.

Figure 12:
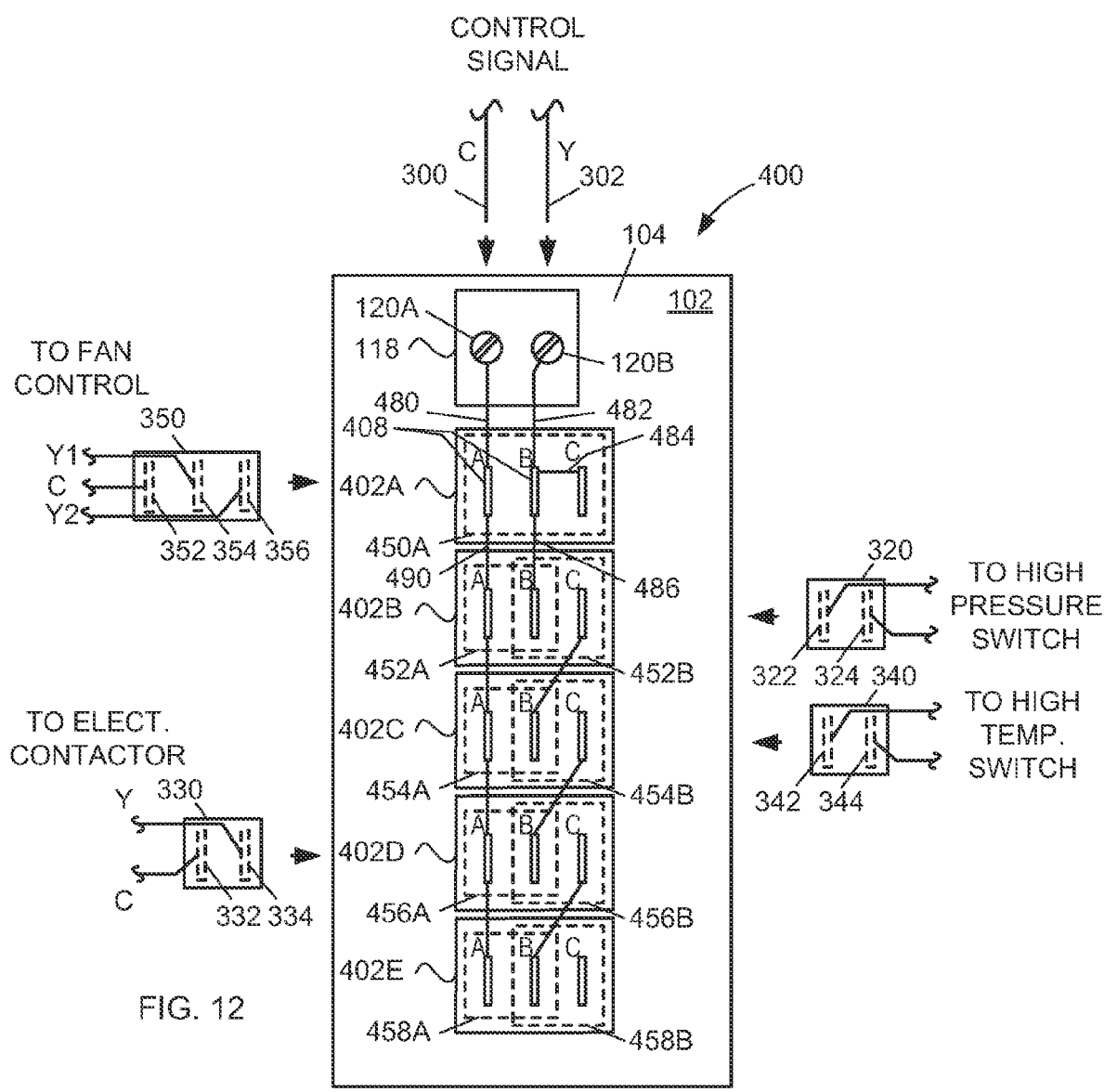
FIG. 12 is a diagram of another embodiment of the control signal routing apparatus of FIG. 11 illustrating how the routing apparatus may be used to route the control signal to the fan motor control unit, and to the electrical contactor via the high pressure switch and the high temperature switch.

FIG. 12 is a diagram of another embodiment of the control signal routing apparatus 400 of FIG. 11, and illustrates how the routing apparatus 400 may be used to route the control signal to the fan motor control unit, and to the electrical contactor via the high pressure switch and the high temperature switch. As indicated in FIG. 12 and described above, the portion 450A of the routing connector 402A includes the tab terminals "A," "B," and "C," and a surrounding portion of the housing, and is adapted to receive the plug connector 350 of the fan motor control unit. In the embodiment of FIG. 11, when the plug connector 350 of the fan motor control unit is inserted into the portion 450A, the female terminals 352, 354, and 356 of the plug connector 350 make physical and electrical contact with the tab terminals "A," "B," and "C," respectively, of the portion 450A of the routing connector 402A.

The portion 452B of the routing connector 402B is adapted to receive the plug connector 320 of the high pressure switch, and the portion 454B of the routing connector 402C is adapted to receive the plug connector 320 of the high pressure switch. The portion 456A of the routing connector 402D are adapted to receive the plug connector 330 of the electrical contactor. The electrical conductor 484 is connected between the tab terminals "B" and "C" of the routing connector 402A, and the electrical conductor 486 is connected between the tab terminal "B" of the routing connector 402A and the tab terminal "B" of the routing connector 402B.

When the wires 300 and 302 conveying the control signal are inserted into the corresponding terminals 120A and 120B of the control signal connector 118, the plug connector 350 of the fan motor control unit is inserted into the portion 450A of the routing connector 402A, the plug connector 320 of the high pressure switch is inserted into the portion 452B of the routing connector 402B, the plug connector 340 of the high temperature switch is inserted into the portion 454B of the routing connector 402C, and the plug connector 330 of the electrical contactor is inserted into the portion 456A of the routing connector 402D, the control signal routing apparatus 400 routes the control signal to the fan motor control unit, and to the electrical contactor via the high pressure switch and the high temperature switch. The fan motor control unit receives the control signal as the Y1 control signal via the electrical conductor 482, and as the Y2 control signal via the electrical conductor 484. The electrical connector 486 and other electrical conductors route the control signal through the high pressure switch, the high temperature switch, and the electrical contactor in series such that control signal is provided to the electrical contactor when the control signal is present (or active), the high pressure switch is closed, and the high temperature switch is closed.

In other embodiments, one or more of the routing connectors 402A-402E of the control signal routing apparatus 400 may have corresponding optional lighted indicators and corresponding optional indicator control circuits similar to the lighted indicators 504A-E and the corresponding optional indicator control circuits 502A-E shown in FIG. 10 and described above.

Figure 13:
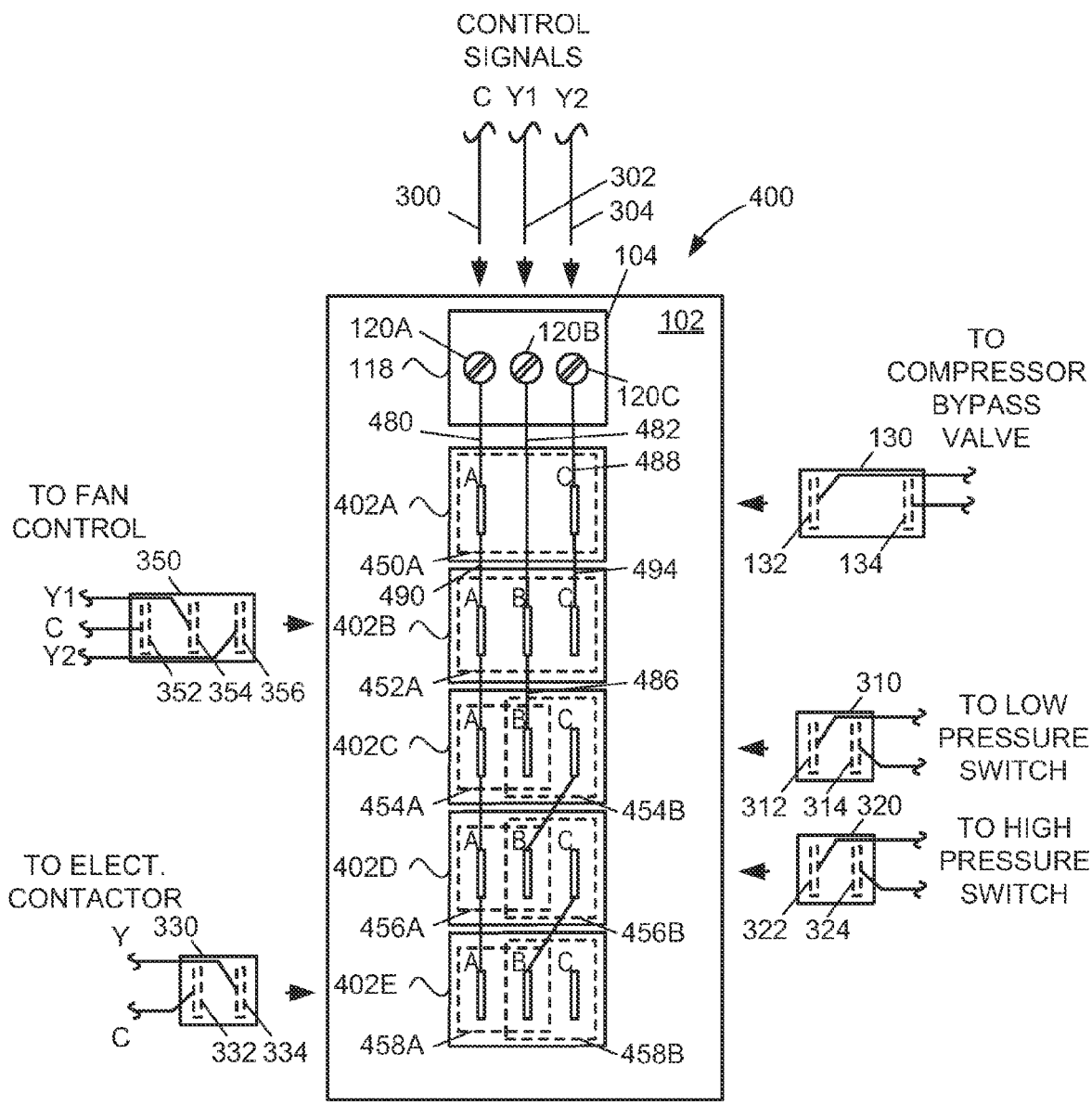
FIG. 13 is a diagram of another embodiment of the control signal routing apparatus of FIG. 11 and illustrating how the routing apparatus may be used to route the first control signal to the electrical contactor and to the fan motor control unit via a low pressure switch and a high pressure switch, and the second control signal to the fan motor control unit and to the compressor bypass valve.

FIG. 13 is a diagram of another embodiment of the control signal routing apparatus 400 of FIG. 11, and illustrates how the routing apparatus 400 may be used to route the Y1 control signal to the electrical contactor and to the fan motor control unit via a low pressure switch and a high pressure switch, and the Y2 control signal to the fan motor control unit and to the compressor bypass valve. In the embodiment of FIG. 13, the control signal connector 118 includes three screws terminals—the two screw terminals 120A and 120B described above, and a third screw terminal labeled "120C" in FIG. 13. A wire 304 is connected to the screw terminal 120C. The wires 300 and 302 convey the Y1 control signal, and the wires 300 and 304 convey the Y2 control signal. The Y1 control signal may be, for example, a first stage cooling control signal, and the Y2 control signal may be a second stage cooling control signal.

In the embodiment of FIG. 13, the routing connector 402A includes only tab terminals "A" and "C." The portion 450A of the routing connector 402A includes the tab terminals "A" and "C" and a surrounding portion of the housing, and is adapted to receive the plug connector 130 of the compressor bypass valve. The electrical conductor 482 is connected between the screw terminal 120B of the control signal connector 118 and the tab terminal "B" of the routing connector 402B, and the electrical conductor 486 is connected between the tab terminal "B" of the routing connector 402B and the tab terminal "B" of the routing connector 402C. An electrical conductor 488 is connected between the screw terminal 120C of the control signal connector 118 and the tab terminal "C" of the routing connector 402A, and another electrical conductor 494 is connected between the tab terminal "C" of the routing connector 402A and the tab terminal "C" of the routing connector 402B. When the plug connector 130 of the compressor bypass valve is inserted into the portion 450A, the female terminal 132 of the plug connector 130 makes physical and electrical contact with the tab terminal "A" of the portion 450A of the routing connector 402A, and the female terminal 134 of the plug connector 130 makes physical and electrical contact with the tab terminal "C."

In the embodiment of FIG. 13, the portion 452A of the routing connector 402B includes the tab terminals "A," "B," and "C," and a surrounding portion of the housing, and is adapted to receive the plug connector 350 of the fan motor control unit. In the embodiment of FIG. 13, when the plug connector 350 of the fan motor control unit is inserted into the portion 452A, the female terminals 352, 354, and 356 of the plug connector 350 make physical and electrical contact with the tab terminals "A," "B," and "C," respectively, of the portion 452A of the routing connector 402B.

The portion 454B of the routing connector 402C is adapted to receive the plug connector 310 of the low pressure switch, and the portion 456B of the routing connector 402D is adapted to receive the plug connector 320 of the high pressure switch. The portion 458A of the routing connector 402E is adapted to receive the plug connector 330 of the electrical contactor.

When the wires 300, 302, and 304 conveying the control signals Y1 and Y2 are inserted into the terminals 120A, 120B, and 120C of the control signal connector 118, the plug connector 130 of compressor bypass valve is inserted into the portion 450A of the routing connector 402A, the plug connector 350 of the fan motor control unit is inserted into the portion 452A of the routing connector 402B, the plug connector 310 of the low pressure switch is inserted into the portion 454B of the routing connector 402C, the plug connector 320 of the high pressure switch is inserted into the portion 456B of the routing connector 402D, and the plug connector 330 of the electrical contactor is inserted into the portion 458A of the routing connector 402E, the control signal routing apparatus 400 routes the Y2 control signal to the compressor bypass valve, the Y1 and Y2 control signals to the fan motor control unit, and the Y1 control signal to the electrical contactor via the low pressure switch and the high pressure switch.

As described above, the Y1 control signal may be a stage one cooling control signal, and the Y2 control signal may be a stage two cooling control signal. The compressor bypass valve may be, for example, open when the Y2 control signal is absent, allowing a portion of a refrigerant flow to enter a return line and decreasing mechanical and electrical loading of the compressor. When the Y2 control signal is present, the compressor bypass valve may be closed, preventing the portion of the refrigerant flow from entering the return line and increasing the mechanical and electrical loading of the compressor.

In the embodiment of FIG. 13, the fan motor control unit operates the fan motor to run at the low speed and the high speed dependent upon the Y1 control signal and the Y2 control signal. More specifically, when the Y1 control signal is present and the Y2 control signal is absent, the fan motor control unit controls the fan motor to run at the low speed.

When both the Y1 and Y2 control signals are present, the fan motor control unit controls the fan motor to run at the high speed.

In the embodiment of FIG. 13, The fan motor control unit receives the Y1 control signal via the electrical conductor 482, and the Y2 control signal via the electrical conductors 488 and 490. Several electrical connectors route the Y1 control signal through the low pressure switch, the high pressure switch, and the electrical contactor in series such that Y1 control signal is provided to the electrical contactor when the Y1 control signal is present (or active), and the low pressure switch and the high pressure switch are both closed.

In other embodiments, one or more of the routing connectors 402A-402E of the control signal routing apparatus 400 may have corresponding optional lighted indicators and corresponding optional indicator control circuits similar to the lighted indicators 504A-E and the corresponding optional indicator control circuits 502A-E shown in FIG. 10 and described above.

Numerous variations and modifications will become apparent to those skilled in the art once the above disclosure is fully appreciated. It is intended that the following claims be interpreted to embrace all such variations and modifications.

What is claimed is:

1. A control signal routing apparatus, comprising:
   a substrate having a surface;
   a plurality of routing connectors each mounted on the surface and adapted for receiving and routing the control signal, wherein each of the routing connectors comprises a housing and a first, a second, and a third electrical terminals arranged within a cavity of the housing, and wherein each of the routing connectors comprises two portions each adapted to receive a plug connector, and wherein the routing connectors are ordered one after another to form a sequence;
   a first set of at least one electrical conductor each positioned on or in the substrate and connecting the first electrical terminal of one of the routing connectors to the first electrical terminal of a sequential next one of the routing connectors; and
   a second set of at least one electrical conductor each positioned on or in the substrate and connecting the third electrical terminal of one of the routing connectors to the second electrical terminal of a sequential next one of the routing connectors.

2. The control signal routing apparatus as recited in claim 1, wherein the first and second electrical terminals of each of the routing connectors are adjacent one another, and wherein the second and third electrical terminals of each of the routing connectors are adjacent one another.

3. The control signal routing apparatus as recited in claim 1, further comprising a control signal connector mounted on the surface and adapted to receive the control signal and to provide the control signal to one of the routing connectors.

4. The control signal routing apparatus as recited in claim 1, wherein a first portion of each of the routing connectors comprises the first and second electrical terminals and a surrounding portion of the housing, and wherein the second portion of each of the routing connectors comprises the second and third electrical terminals and a surrounding portion of the housing.

5. The control signal routing apparatus as recited in claim 4, wherein the first portion of each of the routing connectors is adapted to receive a plug connector of an electrical contactor.

6. The control signal routing apparatus as recited in claim 4, wherein the second portion of each of the routing connectors is adapted to receive a plug connector of an electrical switch.

7. The control signal routing apparatus as recited in claim 6, wherein the electrical switch comprises a pressure switch, a temperature switch, or a manual switch.

* * * * *